(12) United States Patent
Beers

(10) Patent No.: US 10,918,164 B2
(45) Date of Patent: *Feb. 16, 2021

(54) LACING SYSTEM WITH GUIDE ELEMENTS

(71) Applicant: NIKE, Inc., Beaverton, OR (US)

(72) Inventor: Tiffany A. Beers, Portland, OR (US)

(73) Assignee: NIKE, Inc., Beaverton, OR (US)

( * ) Notice: Subject to any disclaimer, the term of this patent is extended or adjusted under 35 U.S.C. 154(b) by 59 days.

This patent is subject to a terminal disclaimer.

(21) Appl. No.: 15/885,953

(22) Filed: Feb. 1, 2018

(65) Prior Publication Data

US 2018/0153260 A1 Jun. 7, 2018

Related U.S. Application Data

(60) Division of application No. 14/950,785, filed on Nov. 24, 2015, now Pat. No. 9,907,359, which is a continuation-in-part of application No. 14/310,586, filed on Jun. 20, 2014, now Pat. No. 9,307,804, which is a continuation of application No. 13/955,007, filed on Jul. 31, 2013, now Pat. No. 8,769,844, which is a continuation of application No. 13/236,221, filed on Sep. 19, 2011, now Pat. No. 8,522,456, which is a
(Continued)

(51) Int. Cl.
| A43C 1/00 | (2006.01) |
| A43C 11/00 | (2006.01) |
| A43B 3/00 | (2006.01) |
| A43B 11/00 | (2006.01) |
| A43C 11/16 | (2006.01) |

(52) U.S. Cl.
CPC .............. *A43C 1/00* (2013.01); *A43B 3/0005* (2013.01); *A43B 11/00* (2013.01); *A43C 11/00* (2013.01); *A43C 11/008* (2013.01); *A43C 11/165* (2013.01); *Y10T 24/2183* (2015.01)

(58) Field of Classification Search
CPC ... A43C 1/00; A43C 11/165; A43C 11/00008; A43B 3/0005; A43B 11/00
USPC ......................................................... 36/50.1
See application file for complete search history.

(56) References Cited

U.S. PATENT DOCUMENTS

| 3,008,038 A | 11/1961 | Dickens |
| 3,070,907 A | 1/1963 | Joseph |
| 3,496,505 A | 2/1970 | Johannsen et al. |
(Continued)

FOREIGN PATENT DOCUMENTS

| CN | 2173521 Y | 8/1994 |
| CN | 2438353 Y | 7/2001 |
(Continued)

OTHER PUBLICATIONS

"U.S. Appl. No. 15/953,621 Preliminary Amendment Filed Apr. 23, 2018", 7 pgs.
(Continued)

*Primary Examiner* — Ted Kavanaugh
(74) *Attorney, Agent, or Firm* — Schwegman Lundberg & Woessner, P.A.

(57) ABSTRACT

An article of footwear with various types of guide elements is disclosed. The article of footwear provides a set of tensile elements that can be moved through the guide elements to switch between a loosened and tightened position of the upper. The tensile elements may be routed through a guide element associated with the upper that can provide compressive strength and support.

10 Claims, 14 Drawing Sheets

Related U.S. Application Data division of application No. 12/114,022, filed on May 2, 2008, now Pat. No. 8,046,937.

(56) References Cited

U.S. PATENT DOCUMENTS

| | | | |
|---|---|---|---|
| 3,668,791 | A | 6/1972 | Salzman et al. |
| 3,893,247 | A | 7/1975 | Dana, III |
| 3,946,505 | A | 3/1976 | Dana, III |
| 4,020,572 | A | 5/1977 | Chiaramonte, Jr. |
| 4,112,601 | A | 9/1978 | Chiaramonte |
| 4,130,951 | A | 12/1978 | Powell |
| 4,158,922 | A | 6/1979 | Dana, III |
| 4,253,253 | A | 3/1981 | Mccormick |
| 4,426,796 | A | 1/1984 | Spademan |
| 4,433,456 | A | 2/1984 | Baggio |
| 4,494,324 | A | 1/1985 | Spademan |
| 4,551,933 | A | 11/1985 | Morell et al. |
| 4,619,057 | A | 10/1986 | Sartor et al. |
| 4,644,671 | A | 2/1987 | Walkhoff |
| 4,670,999 | A | 6/1987 | Olivieri |
| 4,724,626 | A | 2/1988 | Baggio |
| 4,741,115 | A | 5/1988 | Pozzobon |
| 4,848,009 | A | 7/1989 | Rodgers |
| 4,895,110 | A | 1/1990 | LoCascio |
| 4,922,634 | A | 5/1990 | Seidel |
| 4,924,605 | A | 5/1990 | Spademan |
| 4,999,936 | A | 3/1991 | Calamia et al. |
| 5,033,212 | A | 7/1991 | Evanyk |
| 5,060,402 | A | 10/1991 | Rosen |
| 5,157,813 | A | 10/1992 | Carroll |
| 5,174,051 | A | 12/1992 | Walkhoff et al. |
| 5,188,447 | A | 2/1993 | Chiang et al. |
| 5,205,055 | A | 4/1993 | Harrell |
| 5,245,516 | A | 9/1993 | De Haas et al. |
| 5,285,586 | A | 2/1994 | Goldston et al. |
| 5,303,131 | A | 4/1994 | Wu |
| 5,303,485 | A | 4/1994 | Goldston et al. |
| 5,311,677 | A | 5/1994 | Mann et al. |
| 5,311,678 | A | 5/1994 | Spademan |
| 5,325,613 | A | 7/1994 | Sussmann |
| 5,329,432 | A | 7/1994 | Bland |
| 5,373,651 | A | 12/1994 | Wood |
| 5,381,615 | A | 1/1995 | Macmillan |
| 5,396,718 | A | 3/1995 | Schuler et al. |
| 5,396,720 | A | 3/1995 | Hwang et al. |
| 5,406,724 | A | 4/1995 | Lin |
| 5,408,764 | A | 4/1995 | Wut |
| 5,457,900 | A | 10/1995 | Roy |
| 5,461,188 | A | 10/1995 | Drago et al. |
| 5,469,342 | A | 11/1995 | Chien |
| 5,479,325 | A | 12/1995 | Chien |
| 5,483,759 | A | 1/1996 | Silverman |
| 5,490,338 | A | 2/1996 | Hwang et al. |
| 5,495,136 | A | 2/1996 | Chiang et al. |
| 5,500,635 | A | 3/1996 | Mott |
| 5,546,681 | A | 8/1996 | Goldston et al. |
| 5,570,945 | A | 11/1996 | Chien et al. |
| 5,572,817 | A | 11/1996 | Chien |
| 5,599,088 | A | 2/1997 | Chien |
| 5,611,621 | A | 3/1997 | Chien |
| 5,644,858 | A | 7/1997 | Bemis |
| 5,647,104 | A | 7/1997 | James |
| 5,649,755 | A | 7/1997 | Rapisarda |
| 5,651,197 | A | 7/1997 | James |
| 5,692,324 | A | 12/1997 | Goldston et al. |
| 5,704,705 | A | 1/1998 | Chien |
| 5,704,706 | A | 1/1998 | Goldston et al. |
| 5,732,486 | A | 3/1998 | Rapisarda |
| 5,746,499 | A | 5/1998 | Ratcliffe et al. |
| 5,771,611 | A | 6/1998 | Chang |
| 5,791,021 | A | 8/1998 | James |
| 5,791,068 | A * | 8/1998 | Bernier ............ A43B 1/0072 36/50.1 |
| 5,794,366 | A | 8/1998 | Chien |
| 5,806,960 | A | 9/1998 | Chien |
| 5,812,063 | A | 9/1998 | Weng et al. |
| 5,813,148 | A | 9/1998 | Guerra |
| 5,829,169 | A | 11/1998 | James |
| 5,839,210 | A | 11/1998 | Bernier et al. |
| 5,857,273 | A | 1/1999 | Rapisarda |
| 5,860,727 | A | 1/1999 | Chien |
| 5,865,523 | A | 2/1999 | Chien |
| 5,866,987 | A | 2/1999 | Wut |
| 5,879,069 | A | 3/1999 | Chien |
| 5,894,201 | A | 4/1999 | Wong |
| 5,894,686 | A | 4/1999 | Parker et al. |
| 5,909,088 | A | 6/1999 | Wut |
| 5,930,921 | A | 8/1999 | Sorofman et al. |
| 5,933,985 | A | 8/1999 | James |
| 5,934,599 | A | 8/1999 | Hammerslag |
| 5,947,580 | A | 9/1999 | Chien |
| 5,950,335 | A | 9/1999 | Okajima |
| 5,955,957 | A | 9/1999 | Calabrese et al. |
| 5,969,479 | A | 10/1999 | Wong |
| 5,983,530 | A | 11/1999 | Chou |
| 6,012,822 | A | 1/2000 | Robinson |
| 6,017,128 | A | 1/2000 | Goldston et al. |
| 6,032,387 | A * | 3/2000 | Johnson ............ A43C 1/06 36/118.1 |
| 6,035,556 | A | 3/2000 | Ballinger et al. |
| 6,052,921 | A * | 4/2000 | Oreck ............ A43C 1/00 36/50.1 |
| 6,104,140 | A | 8/2000 | Wut |
| 6,112,437 | A | 9/2000 | Lovitt |
| 6,199,305 | B1 | 3/2001 | Steuerwald et al. |
| 6,202,953 | B1 | 3/2001 | Hammerslag |
| 6,280,045 | B1 | 8/2001 | Anteby et al. |
| 6,289,558 | B1 | 9/2001 | Hammerslag |
| 6,378,230 | B1 | 4/2002 | Rotem et al. |
| 6,427,361 | B1 | 8/2002 | Chou |
| 6,457,261 | B1 | 10/2002 | Crary |
| 6,467,194 | B1 | 10/2002 | Johnson |
| 6,619,812 | B2 | 9/2003 | Rapisarda |
| 6,643,954 | B2 | 11/2003 | Voswinkel |
| 6,691,433 | B2 | 2/2004 | Liu |
| 6,764,193 | B1 | 7/2004 | Wei |
| 6,789,913 | B2 | 9/2004 | Wei |
| 6,837,590 | B2 | 1/2005 | Marston |
| 6,843,578 | B1 | 1/2005 | Cheung |
| 6,896,128 | B1 | 5/2005 | Johnson |
| 6,925,734 | B1 | 8/2005 | Schaeffer |
| 6,952,891 | B2 | 10/2005 | Hirayama |
| 6,991,342 | B2 | 1/2006 | Gonet |
| 7,059,069 | B2 | 6/2006 | Raluy et al. |
| 7,096,559 | B2 | 8/2006 | Johnson |
| 7,103,994 | B2 | 9/2006 | Johnson |
| 7,114,822 | B2 | 10/2006 | Guzman |
| 7,147,337 | B1 | 12/2006 | Rapisarda |
| 7,178,929 | B2 | 2/2007 | Guzman |
| 7,181,870 | B2 | 2/2007 | Guzman |
| 7,188,439 | B2 | 3/2007 | Dibenedetto et al. |
| 7,225,565 | B2 | 6/2007 | Dibenedetto et al. |
| 7,255,468 | B2 | 8/2007 | Capriola |
| 7,395,614 | B1 | 7/2008 | Bailey, Sr. et al. |
| 7,503,131 | B2 | 3/2009 | Nadel et al. |
| 7,510,293 | B2 | 3/2009 | Chyn |
| 7,752,774 | B2 | 7/2010 | Ussher |
| 7,794,101 | B2 | 9/2010 | Galica et al. |
| 8,046,937 | B2 | 11/2011 | Beers et al. |
| 8,056,269 | B2 | 11/2011 | Beers et al. |
| 8,058,837 | B2 | 11/2011 | Beers et al. |
| 8,522,456 | B2 | 9/2013 | Beers et al. |
| 8,528,235 | B2 | 9/2013 | Beers et al. |
| 8,745,896 | B2 | 6/2014 | Dua et al. |
| 8,769,844 | B2 | 7/2014 | Beers et al. |
| 8,935,860 | B2 | 1/2015 | Torres |
| 1,184,396 | A1 | 5/2016 | Trimble |
| 9,907,359 | B2 * | 3/2018 | Beers ............ A43C 11/00 |
| 9,943,139 | B2 | 4/2018 | Beers et al. |
| 2002/0095750 | A1 | 7/2002 | Hammerslag |
| 2003/0066207 | A1 | 4/2003 | Gaither |
| 2003/0070324 | A1 | 4/2003 | Nelson |
| 2003/0150135 | A1 | 8/2003 | Liu |
| 2004/0103563 | A1 | 6/2004 | Linge |

(56) References Cited

U.S. PATENT DOCUMENTS

| | | |
|---|---|---|
| 2004/0181972 A1 | 9/2004 | Csorba |
| 2004/0255490 A1 | 12/2004 | Wan et al. |
| 2005/0018417 A1 | 1/2005 | Chien |
| 2005/0018450 A1 | 1/2005 | Chien |
| 2005/0126043 A1 | 6/2005 | Reagan et al. |
| 2005/0183294 A1 | 8/2005 | Guzman |
| 2005/0198867 A1 | 9/2005 | Labbe |
| 2005/0207138 A1 | 9/2005 | Cheung |
| 2005/0235523 A1 | 10/2005 | Flechsig et al. |
| 2005/0284001 A1 | 12/2005 | Hoffman et al. |
| 2005/0286244 A1 | 12/2005 | Weng |
| 2005/0286248 A1 | 12/2005 | Weng |
| 2006/0002134 A1 | 1/2006 | Capriola |
| 2006/0007668 A1 | 1/2006 | Chien |
| 2006/0007670 A1 | 1/2006 | Chien |
| 2006/0101674 A1 | 5/2006 | Ungari |
| 2006/0156517 A1 | 7/2006 | Hammerslag et al. |
| 2006/0198121 A1 | 9/2006 | Thorpe et al. |
| 2006/0221596 A1 | 10/2006 | Chang |
| 2006/0262517 A1 | 11/2006 | Doerer et al. |
| 2007/0000154 A1 | 1/2007 | Dibenedetto et al. |
| 2007/0011912 A1 | 1/2007 | Clark et al. |
| 2007/0011914 A1 | 1/2007 | Keen et al. |
| 2007/0011919 A1 | 1/2007 | Case |
| 2007/0011920 A1 | 1/2007 | Dibenedetto et al. |
| 2007/0028486 A1 | 2/2007 | Montanya et al. |
| 2007/0041193 A1 | 2/2007 | Wong et al. |
| 2007/0147026 A1 | 6/2007 | Tseng |
| 2007/0180736 A1 | 8/2007 | Dibenedetto et al. |
| 2007/0180737 A1 | 8/2007 | Dibenedetto et al. |
| 2007/0201221 A1 | 8/2007 | Cherdak et al. |
| 2007/0211451 A1 | 9/2007 | Chung |
| 2007/0236915 A1 | 10/2007 | Chen |
| 2007/0267398 A1 | 11/2007 | Mccoy |
| 2008/0054845 A1 | 3/2008 | Wang |
| 2008/0060224 A1 | 3/2008 | Whittlesey et al. |
| 2008/0086911 A1 | 4/2008 | Labbe |
| 2008/0197126 A1 | 8/2008 | Bourke et al. |
| 2008/0246439 A1 | 10/2008 | Tsui et al. |
| 2009/0199435 A1 | 8/2009 | Robinson, Jr. et al. |
| 2009/0272007 A1 | 11/2009 | Beers et al. |
| 2009/0272013 A1 | 11/2009 | Beers et al. |
| 2010/0033321 A1 | 2/2010 | Kaminski et al. |
| 2010/0115799 A1 | 5/2010 | Welter et al. |
| 2012/0000091 A1 | 1/2012 | Cotterman et al. |
| 2013/0138029 A1 | 5/2013 | Gerber et al. |
| 2014/0026440 A1 | 1/2014 | Beers et al. |
| 2014/0068838 A1 | 3/2014 | Beers et al. |
| 2014/0082963 A1 | 3/2014 | Beers |
| 2014/0196314 A1 | 7/2014 | Beye et al. |
| 2014/0196316 A1* | 7/2014 | Follet ................ A43B 23/0245 36/84 |
| 2014/0245638 A1 | 9/2014 | Seamarks et al. |
| 2014/0338225 A1 | 11/2014 | Bliss |
| 2014/0360047 A1 | 12/2014 | Beers et al. |
| 2016/0143396 A1 | 5/2016 | Beers |
| 2016/0219985 A1 | 8/2016 | Beers et al. |
| 2018/0228250 A1 | 8/2018 | Beers et al. |
| 2020/0221827 A1 | 7/2020 | Beers et al. |

FOREIGN PATENT DOCUMENTS

| | | |
|---|---|---|
| CN | 2521934 Y | 11/2002 |
| CN | 1387743 A | 12/2002 |
| CN | 2534836 Y | 2/2003 |
| CN | 1742516 A | 3/2006 |
| CN | 1810172 A | 8/2006 |
| CN | 2810253 Y | 8/2006 |
| CN | 2914720 Y | 6/2007 |
| CN | 102014682 A | 4/2011 |
| CN | 102715706 B | 2/2015 |
| CN | 102726888 B | 8/2015 |
| CN | 104902772 A | 9/2015 |
| CN | 108495568 A | 9/2018 |
| EP | 0056953 A1 | 8/1982 |
| EP | 0056953 A2 | 8/1982 |
| EP | 0121026 A1 | 10/1984 |
| EP | 0534560 A1 | 3/1993 |
| EP | 2283276 A1 | 2/2011 |
| EP | 2796064 A1 | 10/2014 |
| EP | 2278896 B1 | 1/2018 |
| EP | 2278897 B1 | 5/2018 |
| EP | 2283276 B1 | 5/2018 |
| FR | 2643794 A1 | 9/1990 |
| JP | 6270802 U | 5/1987 |
| JP | 62290402 A | 12/1987 |
| JP | 0499502 A | 3/1992 |
| JP | 3033166 U | 1/1997 |
| JP | 10502261 A | 3/1998 |
| JP | 10225305 A | 8/1998 |
| JP | 2000014402 A | 1/2000 |
| JP | 2001513379 A | 9/2001 |
| JP | 2000014410 A | 1/2002 |
| JP | 2002119498 A | 4/2002 |
| JP | 2002238611 A | 8/2002 |
| JP | 3092657 U | 3/2003 |
| JP | 2004222782 A | 8/2004 |
| JP | 2005029168 A | 2/2005 |
| JP | 2006288783 A | 10/2006 |
| TW | M299404 U | 10/2006 |
| WO | WO-9415494 A1 | 7/1994 |
| WO | WO-0115559 A1 | 3/2001 |
| WO | WO-2006050266 A2 | 5/2006 |
| WO | WO-2008101203 A1 | 8/2008 |
| WO | WO-2009134858 A1 | 11/2009 |
| WO | WO-2009134864 A3 | 11/2009 |
| WO | WO-2017091769 A1 | 6/2017 |
| WO | WO-2017091769 A8 | 6/2017 |

OTHER PUBLICATIONS

"International Application Serial No. PCT/US2016/063670, International Preliminary Report on Patentability dated Jun. 7, 2018", 11 pgs.

"European Application Serial No. 18150821.9, Extended European Search Report dated Sep. 18, 2018", 7 pgs.

"European Application Serial No. 16869306.7, Response filed Jan. 4, 2019 to Communication Pursuant to Rules 161 and 162 dated Jul. 11, 2018", 14 pgs.

"European Application Serial No. 18150821.9, Response filed Apr. 17, 2019 to Extended European Search Report dated Sep. 18, 2018", 19 pgs.

"U.S. Appl. No. 15/953,621, Restriction Requirement dated Oct. 8, 2019", 7 pgs.

"Chinese Application Serial No. 201680079902.6, Office Action dated Sep. 12, 2019", w/ English translation, 9 pgs.

"Chinese Application Serial No. 201680079902.6, Voluntary Amendment filed Nov. 26, 2018", w/English claims, 7 pgs.

"European Application Serial No. 16869306.7, Extended European Search Report dated Sep. 18, 2019", 8 pgs.

"U.S. Appl. No. 12/114,022, Non Final Office Action dated Jun. 15, 2011", 8 pgs.

"U.S. Appl. No. 12/114,022, Notice of Allowance dated Aug. 10, 2011", 5 pgs.

"U.S. Appl. No. 12/114,022, Response filed JUn. 3, 2011 to Restriction Requirement dated May 5, 2011", 13 pgs.

"U.S. Appl. No. 12/114,022, Response filed Jul. 25, 2011 to Non Final Office Action dated Jun. 15, 2011", 12 pgs.

"U.S. Appl. No. 12/114,022, Restriction Requirement dated May 5, 2011", 6 pgs.

"U.S. Appl. No. 12/369,400, 312 Amendment filed Sep. 30, 2011", 2 pgs.

"U.S. Appl. No. 12/369,400, Examiner Interview Summary dated Aug. 19, 2011", 3 pgs.

"U.S. Appl. No. 12/369,400, Non Final Office Action dated Jun. 15, 2011", 6 pgs.

"U.S. Appl. No. 12/369,400, Notice of Allowance dated Sep. 7, 2011", 5 pgs.

(56) References Cited

OTHER PUBLICATIONS

"U.S. Appl. No. 12/369,400, PTO Response to Rule 312 Communication dated Oct. 14, 2011", 2 pgs.

"U.S. Appl. No. 12/369,400, Response filed Aug. 24, 2011 to Non Final Office Action dated Jun. 15, 2011", 12 pgs.

"U.S. Appl. No. 12/369,410, Examiner Interview Summary dated Aug. 8, 2011", 3 pgs.

"U.S. Appl. No. 12/369,410, Non Final Office Action dated May 11, 2011", 11 pgs.

"U.S. Appl. No. 12/369,410, Notice of Allowance dated Sep. 12, 2011", 8 pgs.

"U.S. Appl. No. 12/369,410, Response filed Aug. 10, 2011 to Non Final Office Action dated May 11, 2011", 12 pgs.

"U.S. Appl. No. 13/236,221, Non Final Office Action dated Feb. 7, 2013", 8 pgs.

"U.S. Appl. No. 13/236,221, Notice of Allowance dated May 14, 2013", 6 pgs.

"U.S. Appl. No. 13/236,221, Response filed May 7, 2013 to Non Final Office Action dated Feb. 7, 2013", 12 pgs.

"U.S. Appl. No. 13/243,236, Examiner Interview Summary dated May 9, 2013", 3 pgs.

"U.S. Appl. No. 13/243,236, Non Final Office Action dated Feb. 12, 2013", 8 pgs.

"U.S. Appl. No. 13/243,236, Notice of Allowance dated May 23, 2013", 6 pgs.

"U.S. Appl. No. 13/243,236, Response filed May 13, 2013 to Non Final Office Action dated Feb. 12, 2013", 12 pgs.

"U.S. Appl. No. 13/955,007, Non Final Office Action dated Dec. 26, 2013", 8 pgs.

"U.S. Appl. No. 13/955,007, Notice of Allowance dated May 1, 2015", 8 pgs.

"U.S. Appl. No. 13/955,007, Response filed Mar. 12, 2014 to Non Final Office Action dated Dec. 26, 2013", 12 pgs.

"U.S. Appl. No. 14/310,586, Advisory Action dated Jan. 23, 2015", 3 pgs.

"U.S. Appl. No. 14/310,586, Final Office Action dated Nov. 14, 2014", 9 pgs.

"U.S. Appl. No. 14/310,586, Non Final Office Action dated May 27, 2015", 9 pgs.

"U.S. Appl. No. 14/310,586, Notice of Allowance dated Dec. 9, 2015", 5 pgs.

"U.S. Appl. No. 14/310,586, Response filed Jan. 20, 2015 to Final Office Action dated Nov. 14, 2014", 7 pgs.

"U.S. Appl. No. 14/310,586, Response filed May 15, 2015 to Restriction Requirement dated Mar. 16, 2015", 3 pgs.

"U.S. Appl. No. 14/310,586, Response filed Nov. 23, 2015 to Non Final Office Action dated May 27, 2015", 10 pgs.

"U.S. Appl. No. 14/310,586, Restriction Requirement dated Mar. 16, 2015", 6 pgs.

"U.S. Appl. No. 14/950,785, Non Final Office Action dated Jul. 5, 2017", 8 pgs.

"U.S. Appl. No. 14/950,785, Notice of Allowance dated Oct. 26, 2017", 8 pgs.

"U.S. Appl. No. 14/950,785, Response filed Jun. 12, 2017 to Restriction Requirement dated Jan. 11, 2017", 6 pgs.

"U.S. Appl. No. 14/950,785, Response filed Oct. 5, 2017 to Non Final Office Action dated Jul. 5, 2017", 8 pgs.

"U.S. Appl. No. 14/950,785, Restriction Requirement dated Jan. 11, 2017", 4 pgs.

"U.S. Appl. No. 15/059,385, Non Final Office Action dated Jul. 6, 2017", 12 pgs.

"U.S. Appl. No. 15/059,385, Notice of Allowance dated Dec. 13, 2017", 7 pgs.

"U.S. Appl. No. 15/059,385, Response filed Jun. 16, 2017 to Restriction Requirement dated Jan. 17, 2017", 7 pgs.

"U.S. Appl. No. 15/059,385, Response filed Nov. 6, 2017 to Non Final Office Action daated Jul. 6, 2017", 10 pgs.

"U.S. Appl. No. 15/059,385, Restriction Requirement dated Jan. 17, 2017", 6 pgs.

"Back to the Future Part II (Universal Pictures 1989)", First appearance of shoes at 8:06 , see also Feature Commentary with Producers Bob Gale and Neil Canton at 8:06-8:32.

"Chinese Application Serial No. 200980115809.6, Decision to Grant dated Oct. 31, 2012", with English Translation, 2 pgs.

"Chinese Application Serial No. 200980115809.6, Office Action dated May 21, 2012", with English translation of claims, 9 pgs.

"Chinese Application Serial No. 200980115809.6, Response filed Sep. 29, 2012 to Office Action dated May 21, 2012", with English translation of claims, 7 pgs.

"Chinese Application Serial No. 200980125209.8, Decision to Grant dated Jan. 28, 2014", with English Translation, with English Translation, 2 pgs.

"Chinese Application Serial No. 200980125209.8, Office Action dated Jun. 20, 2013", with English translation of claims, with English Translation, 21 pgs.

"Chinese Application Serial No. 200980125209.8, Response filed Nov. 5, 2013 to Office Action dated Jun. 20, 2013", with machine translation, 62 pgs.

"Chinese Application Serial No. 200980125531.0, Decision to Grant dated Feb. 13, 2014", English translation, 2 pgs.

"Chinese Application Serial No. 200980125531.0, Office Action dated Jan. 25, 2013", with English translation of claims, 8 pgs.

"Chinese Application Serial No. 200980125531.0, Office Action dated Jun. 1, 2012", with English translation of claims, 14 pgs.

"Chinese Application Serial No. 200980125531.0, Office Action dated Aug. 5, 2013", with English translation of claims, 12 pgs.

"Chinese Application Serial No. 200980125531.0, Response filed Apr. 9, 2013 to Office Action dated Jan. 25, 2013", with English translation of claims, 29 pgs.

"Chinese Application Serial No. 200980125531.0, Response filed Oct. 12, 2012 to Office Action dated Jun. 1, 2012", with English translation of claims, 14 pgs.

"Chinese Application Serial No. 200980125531.0, Response filed Nov. 5, 2013 to Office Action dated Aug. 5, 2013", with machine translation, 10 pgs.

"Chinese Application Serial No. 201210233338.2, Office Action dated May 6, 2014", W/ English Translation, 18 pgs.

"Chinese Application Serial No. 201210233338.2, Office Action dated Dec. 31, 2014", W/ English Translation, 7 pgs.

"Chinese Application Serial No. 201210233338.2, Response filed Sep. 22, 2014 to Office Action dated May 6, 2014", with English translation of claims, 8 pgs.

"Chinese Application Serial No. 201210233338.2, Response filed Mar. 16, 2015", with English translation, 3 pgs.

"Chinese Application Serial No. 201210234324.2, Decision to Grant dated Nov. 15, 2014", English translation, 2 pgs.

"Chinese Application Serial No. 201210234324.2, Office Action dated Mar. 24, 2014", with English translation of claims, 15 pgs.

"Chinese Application Serial No. 201210234324.2, Response filed Aug. 8, 2014 to Office Action dated Mar. 24, 2014", with English translation of claims, 28 pgs.

"European Application Serial No. 09739660.0, Extended European Search Report dated Nov. 28, 2013", 9 pgs.

"European Application Serial No. 09739660.0, Invitation Pursuant to Rule 62a(1) EPC and Rule 63(1) EPC dated Aug. 22, 2013", 3 pgs.

"European Application Serial No. 09739660.0, Response filed Feb. 20, 2014 to Extended European Search Report dated Nov. 28, 2013", 30 pgs.

"European Application Serial No. 09739660.0, Response filed Oct. 4, 2013", 1 pg.

"European Application Serial No. 09739662.6, Intention to Grant dated Jan. 5, 2018", 55 pgs.

"European Application Serial No. 09739662.6, Response filed Jul. 16, 2014 to Extended European Search Report dated Mar. 13, 2014", 19 pgs.

"European Application Serial No. 09739662.6. Extended European Search Report dated Mar. 13, 2014", 8 pgs.

"European Application Serial No. 09739666.7, Extended European Search Report dated Feb. 18, 2014", 6 pgs.

"European Application Serial No. 09739666.7, Response filed May 8, 2012", 1 pg.

(56) References Cited

OTHER PUBLICATIONS

"European Application Serial No. 09739666.7, Response filed May 9, 2014", 20 pgs.
"European Application Serial No. 14160429.8, Decision to grant dated Jan. 8, 2016", English translation, 2 pgs.
"European Application Serial No. 14160429.8, Extended European Search Report dated Sep. 30, 2014", 4 pgs.
"European Application Serial No. 14160429.8, Intention to grant dated Jul. 24, 2015", 6 pgs.
"European Application Serial No. 14160429.8, Response filed Apr. 24, 2015 to Extended European Search Report dated Sep. 30, 2014", 8 pgs.
"European Application Serial No. 14160429.8, Response filed Nov. 24, 2015", with machine translations, 16 pgs.
"First appearance of bag at 7:24 in "Back to the Future, Part II" (Universal Pictures 1989)", You Tube, [Online]. Retrieved from the Internet: <URL: Back to the Future Part II (Universal Pictures 1989)>, (1989), 1 minute, 5 seconds.
"International Application Serial No. PCT/US2009/042072, International Preliminary Report on Patentability dated Nov. 11, 2010", 10 pgs.
"International Application Serial No. PCT/US2009/042072, International Search Report dated Jul. 27, 2009", 2 pgs.
"International Application Serial No. PCT/US2009/042072, Written Opinion dated Feb. 14, 2012", 3 pgs.
"International Application Serial No. PCT/US2009/042072, Written Opinion dated Jul. 27, 2009", 8 pgs.
"International Application Serial No. PCT/US2009/042075, International Preliminary Report on Patentability dated Nov. 11, 2010", 7 pgs.
"International Application Serial No. PCT/US2009/042075, International Search Report dated Jul. 27, 2009", 2 pgs.
"International Application Serial No. PCT/US2009/042075, Written Opinion dated Jul. 27, 2009", 5 pgs.
"International Application Serial No. PCT/US2009/042081, International Preliminary Report on Patentability dated Mar. 15, 2012", 5 pgs.
"International Application Serial No. PCT/US2009/042081, International Search Report dated Feb. 14, 2012", 5 pgs.
"International Application Serial No. PCT/US2009/042081, Written Opinion dated Feb. 14, 2012", 3 pgs.
"International Application Serial No. PCT/US2016/063670, International Search Report dated Mar. 17, 2017", 4 pgs.
"International Application Serial No. PCT/US2016/063670, Written Opinion dated Mar. 17, 2017", 9 pgs.
"Japanese Application Serial No. 2011-507603, Decision to Grant dated Jul. 2, 2013", with English Translation, 6 pgs.
"Japanese Application Serial No. 2011-507603, Office Action dated Mar. 12, 2013", with English translation of claims, with English Translation, 6 pgs.
"Japanese Application Serial No. 2011-507603, Response filed Jun. 3, 2013 to Office Action dated Mar. 12, 2013", 9 pgs.
"Japanese Application Serial No. 2011-507604, Decision to Grant dated Jan. 7, 2014", with English Translation, 6 pgs.
"Japanese Application Serial No. 2011-507604, Office Action dated Mar. 26, 2013", with English translation of claims, with English Translation, 4 pgs.
"Japanese Application Serial No. 2011-507604, Response filed Jun. 18, 2013 to Office Action dated Mar. 26, 2013", with English translation of claims, English Translation of Claims, 17 pgs.
"Japanese Application Serial No. 2011-507605, Decision to Grant dated Nov. 12, 2013", English translation, 6 pgs.
"Japanese Application Serial No. 2011-507605, Office Action dated May 14, 2013", with English translation of claims, with English Translation, 4 pgs.
"Japanese Application Serial No. 2011-507605, Office Action dated Sep. 10, 2013", with English translation of claims, with English Translation, 4 pgs.
"Japanese Application Serial No. 2011-507605, Response filed Aug. 8, 2013 to Office Action dated May 14, 2013", with English translation of claims, 14 pgs.
"Japanese Application Serial No. 2011-507605, Response filed Oct. 3, 2013 to Office Action dated Sep. 10, 2013", English translation of claims, 13 pgs.
"U.S. Appl. No. 15/953,621, Final Office Action dated May 11, 2020", 14 pgs.
"U.S. Appl. No. 15/953,621, Non Final Office Action dated Jan. 28, 2020", 11 pgs.
"U.S. Appl. No. 15/953,621, Response filed Jan. 6, 2020 to Restriction Requirement dated Oct. 8, 2019", 7 pgs.
"U.S. Appl. No. 15/953,621, Response filed Apr. 28, 2020 to Non Final Office Action dated Jan. 28, 2020", 8 pgs.
"U.S. Appl. No. 16/837,810, Preliminary Amendment filed Apr. 2, 2020", 6 pgs.
"Chinese Application Serial No. 201680079902.6, Office Action dated Apr. 10, 2020", w/ English translation, 12 pgs.
"Chinese Application Serial No. 201680079902.6, Response filed Jan. 20, 2020 to Office Action dated Sep. 12, 2019", w/ English claims, 43 pgs.
"Chinese Application Serial No. 201680079902.6, Response filed Jun. 9, 2020 to Office Action dated Apr. 10, 2020", w/ English claims, 44 pgs.
"European Application Serial No. 16869306.7, Response filed Mar. 25, 2020 to Extended European Search Report dated Sep. 18, 2019", 8 pgs.
"U.S. Appl. No. 15/953,621, Advisory Action dated Jul. 21, 2020", 3 pgs.
"U.S. Appl. No. 15/953,621, Examiner Interview Summary dated Jul. 30, 2020", 3 pgs.
"U.S. Appl. No. 15/953,621, Response filed Jul. 13, 2020 to Final Office Action dated May 11, 2020", 7 pgs.
"U.S. Appl. No. 15/953,621, Response filed Oct. 12, 2020 to Advisory Action dated Jul. 21, 2020", 7 pgs.

\* cited by examiner

LACING SYSTEM WITH GUIDE ELEMENTS

CROSS-REFERENCE TO RELATED APPLICATIONS

This application is a divisional of U.S. patent application Ser. No. 14/950,785, filed Nov. 24, 2015, which application is a continuation-in-part of U.S. patent application Ser. No. 14/310,586, filed Jun. 20, 2014, issued on Apr. 12, 2016 as U.S. Pat. No. 9,307,804, which application is a continuation of U.S. patent application Ser. No. 13/955,007, filed Jul. 31, 2013, issued on Jul. 8, 2014 as U.S. Pat. No. 8,769,844, which application is a continuation of U.S. patent application Ser. No. 13/236,221, filed Sep. 19, 2011, issued on Sep. 3, 2013 as U.S. Pat. No. 8,522,456, which application is a divisional of U.S. patent application Ser. No. 12/114,022, filed May 2, 2008, issued on Nov. 1, 2011 as U.S. Pat. No. 8,046,937, which applications are hereby incorporated by reference in their entirety.

BACKGROUND

The present invention relates generally to footwear, and in particular the present invention relates to a lacing system for an article of footwear.

SUMMARY

Embodiments can include provisions to facilitate the guidance of lace or other tensile elements along various portions or components of an article of footwear.

In one aspect, the present disclosure is directed to an article of footwear, comprising an upper, a first guide element attached to the upper, and a first tensile element. The first tensile element is configured to adjust the upper, and is routed through the first guide element. Furthermore, the first tensile element moves through the first guide element when tension is applied to the first tensile element to adjust the upper, and the rigidity of the first guide element is greater than the rigidity of the first tensile element.

In another aspect, the present disclosure is directed to an article of footwear, comprising an upper, a guide element attached to the upper, and a tensile element. The tensile element is routed through the guide element, and the tensile element is configured to adjust the upper when tension is applied to the tensile element. Furthermore, the guide element is incorporated in a first portion of the upper, and the compressive strength of the guide element is greater than the compressive strength of the first portion of the upper. In addition, the curvature of the guide element is substantially similar to the curvature of the first portion of the upper in which the guide element is incorporated.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
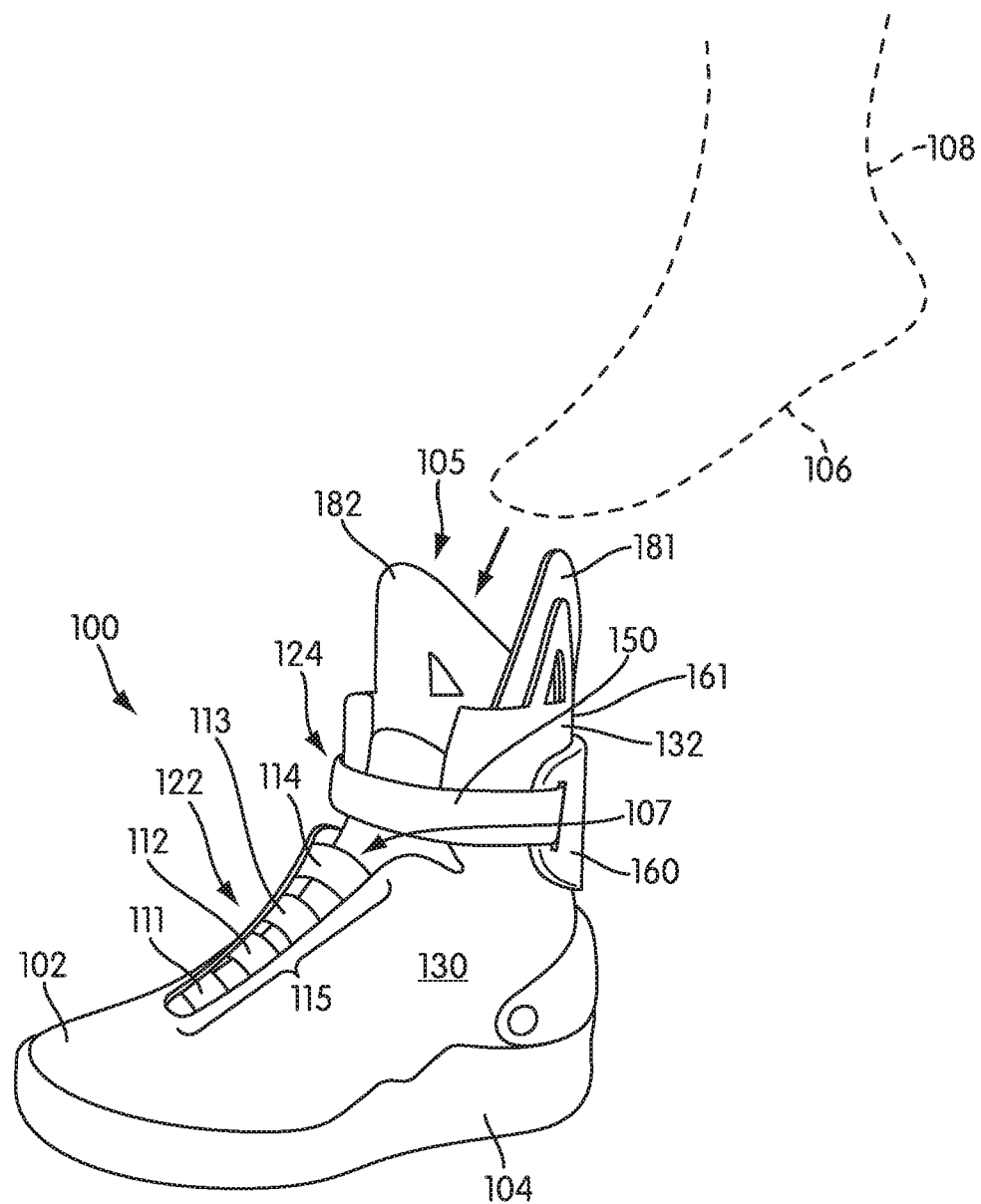
FIG. 1 is an isometric view of an embodiment of an article of footwear.

FIG. 1 is an embodiment of article of footwear ("article") 100, also referred to simply as article 100, in the form of an athletic shoe. For clarity, the following detailed description discusses several embodiments, however, it should be kept in mind that the present embodiments could also take the form of any other kind of footwear, including, for example, skates, boots, ski boots, snowboarding boots, cycling shoes, formal shoes, slippers or any other kind of footwear.

In some embodiments, article 100 in some embodiments includes upper 102. In one case, upper 102 may include entry opening 105 that allows foot 106 to enter upper 102. In other cases, upper 102 also includes an interior cavity that is configured to receive foot 106. In particular, entry opening 105 can provide access to the interior cavity.

In some embodiments, upper 102 may be associated with a sole structure 104. In a one embodiment, upper 102 is attached to sole structure 104. In some cases, upper 102 is connected to sole structure 104 by stitching or an adhesive. In other cases, upper 102 could be integrally formed with sole structure 104.

In some embodiments, sole structure 104 includes a midsole. In other embodiments, sole structure 104 could also include an insole that is configured to contact a foot 106, shown in dotted lines in FIG. 1. In other embodiments, sole structure 104 could include an outsole that is configured to contact a ground surface. In one embodiment, sole structure 104 may comprise a midsole as well as an outsole and an insole.

Generally, upper 102 may have any design. In some embodiments, upper 102 may have the appearance of a low top sneaker. In other embodiments, upper 102 may have the appearance of a high top sneaker. In the embodiment of FIG. 1, upper 102 may include a high ankle portion 132. In particular, upper 102 may include a first extended portion 181 and a second extended portion 182. In the embodiment of FIG. 1, first extended portion 181 and second extended portion 182 have generally triangular shapes. In other embodiments, first extended portion 181 and second extended portion 182 could have another shape. Examples of other shapes include, but are not limited to, rounded shapes, rectangular shapes, polygonal shapes, regular shapes as well as irregular shapes. Using this configuration for ankle portion 132 may help provide upper 102 with additional support for an ankle 108.

Article 100 may include provisions for tightening upper 102 around foot 106. In some embodiments, article 100 may be associated with laces, straps and/or fasteners for tightening upper 102 once foot 106 has been inserted into upper 102. In some cases, article 100 may include laces, straps and/or fasteners that can be manually adjusted by a user. In one embodiment, article 100 may include provisions for automatically adjusting laces, straps and/or other fasteners associated with upper 102. By using automatically adjusting laces, straps and/or other fasteners, upper 102 may be tightened around a foot with a minimal amount of effort from a user. In other embodiments, upper 102 may be tightened manually by a user.

In some embodiments, upper 102 may include individual tightening systems associated with different portions of upper 102. In this exemplary embodiment, upper 102 may include a lacing system that is associated with arch portion 130 of upper 102. In the embodiment of FIG. 1, a first lacing system 122 is shown. Likewise, upper 102 may include automatic ankle cinching system 124 that is associated with ankle portion 132 of upper 102. In one embodiment, first lacing system 122 and automatic ankle cinching system 124 may be configured to automatically tighten and/or loosen upper 102 around foot 106 and ankle 108.

In different embodiments, first lacing system 122 in some embodiments includes a plurality of tensile elements. The term tensile elements as used throughout this detailed description and in the claims refers to any device that can be used for tightening and/or fastening a portion of an article of footwear to a foot. For example, in some cases, tensile elements may include laces, cords, straps, wires, belts, strands, strings or any other fastener elements. Generally, a tensile element could have any shape. In some embodiments, a tensile element could have a rectangular or ribbon-like shape. However, it should be understood that the term tensile element is not intended to be restricted to tightening devices with ribbon-like shapes. In other embodiments, for example, a tensile element could have a lace-like shape. In still other embodiments, a lacing system could be associated with other types of fasteners.

Additionally, a tensile element could be made of any material. Examples of materials that could be used include, but are not limited to, leather, natural fabric, synthetic fabric, metal, rubber, as well as other materials. In some embodiments, a strap could be any type of woven strap as well. In particular, a tensile element could be woven from any material known in the art for producing woven tensile elements.

Generally, a lacing system can include any number of tensile elements. In some embodiments, only a single tensile element may be provided. In other embodiments, multiple tensile elements may be provided. In the embodiment of FIG. 1, first lacing system 122 includes four tensile elements, including a first strap 111, a second strap 112, a third strap 113 and a fourth strap 114. For clarity, first strap 111, second strap 112, third strap 113 and fourth strap 114 may be referred to collectively as a first strap set 115. It should be understood that in other embodiments, first strap set 115 may include any type of tensile element, as described above.

In this embodiment, first strap set 115 is disposed beneath a lacing gap 107 of upper 102. In one embodiment, first strap set 115 may be configured to adjust the size of lacing gap 107. As the size of lacing gap 107 is adjusted, the sidewall portions of upper 102 may move closer together or further apart. With this arrangement, as first strap set 115 is adjusted, upper 102 can be opened and/or closed around the arch of foot 106.

Generally, first strap set 115 may be arranged in any direction on upper 102. In some embodiments, first strap set 115 could extend in a generally longitudinal direction. In some embodiments, first strap set 115 may be arranged in a lateral direction with respect to upper 102. The term "lateral direction" as used in this detailed description and in the claims refers to a direction extending from a medial side of upper 102 to a lateral side of upper 102. In other words, the lateral direction in some embodiments extends along the width of upper 102.

Furthermore, first strap set 115 may include any type of spacing between adjacent straps. In some embodiments, the spacing between adjacent straps could vary. In other embodiments, one or more straps may cross over, or intersect with, one another. In one embodiment, the straps of first strap set 115 may be substantially evenly spaced. In particular, the width between adjacent portions of two straps remains substantially constant. In other words, the straps may be approximately parallel at adjacent portions.

Although a lacing system is configured to tighten and/or loosen upper 102 at arch portion 130 in the current embodiment, in other embodiments, a lacing system could be associated with another portion of upper 102. For example, in another embodiment, the automatic lacing system could be configured to tighten upper 102 at a side portion of upper 102. Additionally, a lacing system could be associated with a toe portion of upper 102. In still another embodiment, a lacing system could be associated with a heel region of upper 102.

Automatic ankle cinching system 124 in some embodiments includes at least one ankle tensile element. In some embodiments, automatic ankle cinching system 124 may include multiple ankle tensile elements. In the embodiment of FIG. 1, automatic ankle cinching system 124 includes an ankle strap 150. Ankle strap 150 could be any type of tensile element, including any type of tensile element previously discussed with respect to the tensile element of first lacing system 122. In some embodiments, ankle strap 150 could be a similar type of strap to the straps of first strap set 115. In other embodiments, ankle strap 150 could be a different type of tensile element from the straps of first strap set 115.

In some embodiments, automatic ankle cinching system 124 also includes provisions for receiving a portion of ankle strap 150. In this embodiment, automatic ankle cinching system 124 includes a housing 160 that is configured to receive a portion of ankle strap 150. Housing 160 could be located anywhere on ankle portion 132 of upper 102. In some cases, housing 160 could be disposed on a side of ankle portion 132. In other cases, housing 160 could be disposed on at the front of ankle portion 132. In the embodiment shown in FIG. 1, housing 160 may be disposed on a rear portion 161 of ankle portion 132.

As will be discussed below, the automatic lacing systems described herein may include different types of guide elements to facilitate the guidance of tensile elements throughout various regions of article of footwear 100. However, it should be understood that the embodiments described herein need not be associated with automatic lacing systems. For example, descriptions relating to the guide elements and tensile elements may be applied to any article of footwear, including articles of footwear that do not include a lacing system. In addition, the guide elements and tensile elements disclosed herein may be used with articles of footwear that include lacing systems that differ from the lacing systems described above.

For purposes of this description, guide elements include structures such as tubes, channels, or hollow plates that can facilitate the route or orientation of a tensile element. Furthermore, guide elements may provide protection or support to tensile elements. Guide elements can vary in size, shape, length, position, and/or arrangement in article of footwear 100. Guide elements may include a hollow portion or chamber through which a tensile element may extend. A variety of guide elements will be discussed below; however, it should be understood that the examples are for illustrative purposes, and that a wide range of guide elements may be used.

A guide element may be made of any substantially rigid material. Examples of various materials that could be used to make a guide element include, but are not limited to, plastic, rigid rubber, metal and wood, as well as other materials. In one embodiment, guide elements are made of a substantially rigid plastic. In other embodiments, guide elements may comprise a composite material. In some embodiments, a guide element is made of a material that is substantially more rigid than the upper. In some embodiments, the rigidity of guide elements may allow tensile elements to move more smoothly and readily through the guide element, and facilitate the translation of a tensile element in different directions through the guide element. In some embodiments, the rigidity or stiffness of the guide element is greater than the rigidity or stiffness of the tensile element with which it is associated. The greater stiffness of guide elements relative to tensile elements can provide the support to tensile elements. Furthermore, the materials associated with guide elements may provide the guide element with high compressive strength relative to the portion of the upper in which they are incorporated. For example, in some cases, the compressive strength of the guide elements can allow the guide elements to resist deformation and maintain a substantially unobstructed route for the sliding of tensile elements within the guide elements, as will be discussed further below.

FIGS. 1-5 illustrate an embodiment of the operation of a first lacing system 122 with automatic ankle cinching system 124 of article 100. In other embodiments, automatic ankle cinching system 124 may not be present, and first lacing system 122 may be used without an automatic ankle cinching system. Initially, as seen in FIG. 1, article 100 may be configured to receive foot 106. In particular, first lacing system 122 and automatic ankle cinching system 124 may be each configured in an open position. In this open position, entry opening 105 may be wide open. Additionally, in this open position, lacing gap 107 may also be wide open. In some embodiments, this open position of first lacing system 122 and/or automatic ankle cinching system 124 may be associated with an open, or loosened, configuration or position of upper 102. In later configurations, first lacing system 122 and/or automatic ankle cinching system 124 may include a closed or tightened configuration, where lacing gap 107 is narrower. In the closed configuration or position, there may be an increase in the tension associated with various portions of upper 102. The closed configuration may be used for securing a foot within an article of footwear in some embodiments.

FIGS. 2-5 are intended to illustrate in detail the individual components and operation of first lacing system 122. It should be understood that the following detailed description discusses several embodiments for a lacing system. In other embodiments, some of which are discussed below, some provisions or components of these systems could be optional. Furthermore, in other embodiments, additional provisions or components could be provided to these systems.

Figure 2:
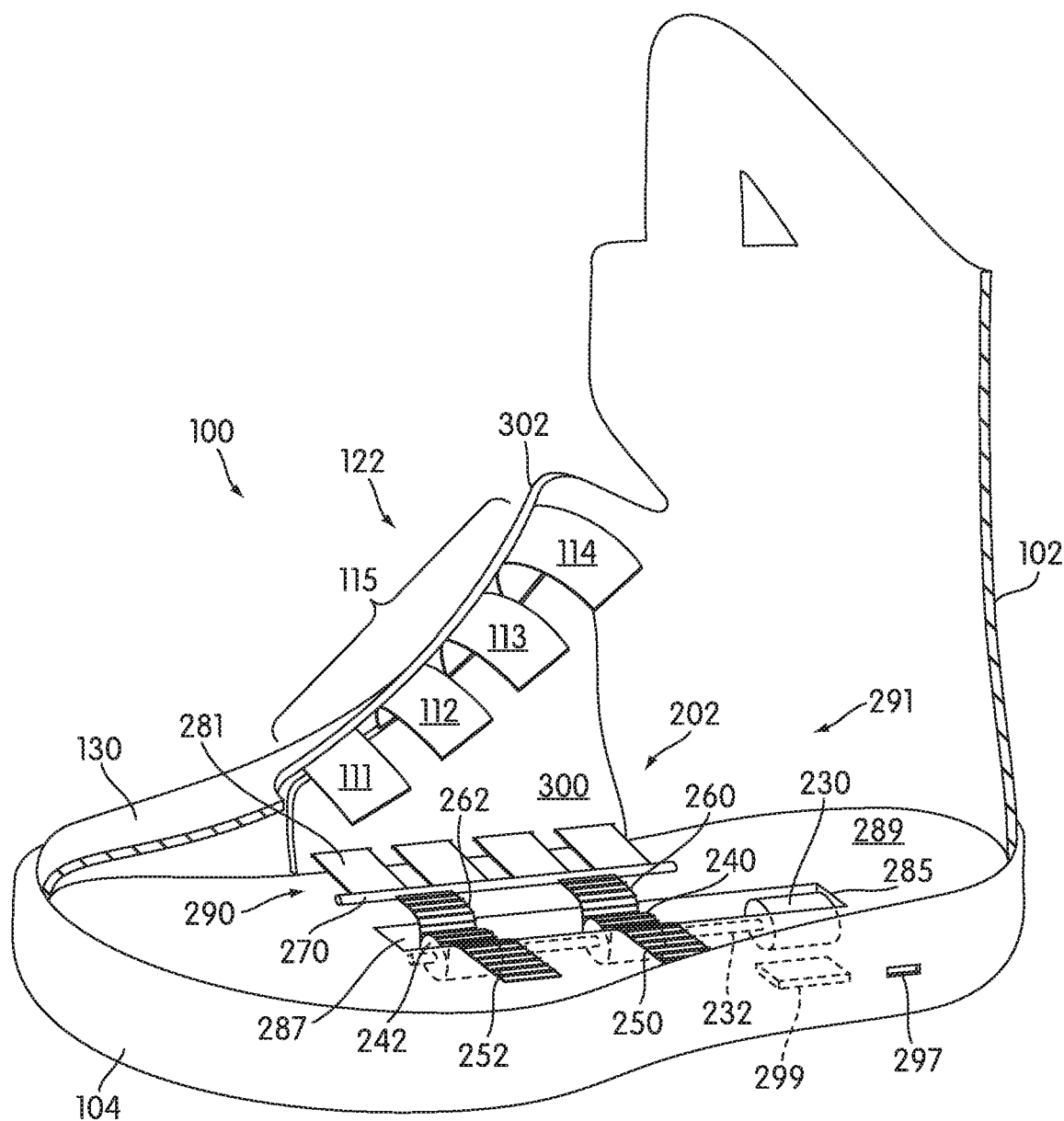
FIG. 2 is a side cross sectional view of an embodiment of an article of footwear including a lacing system.
Figure 3:
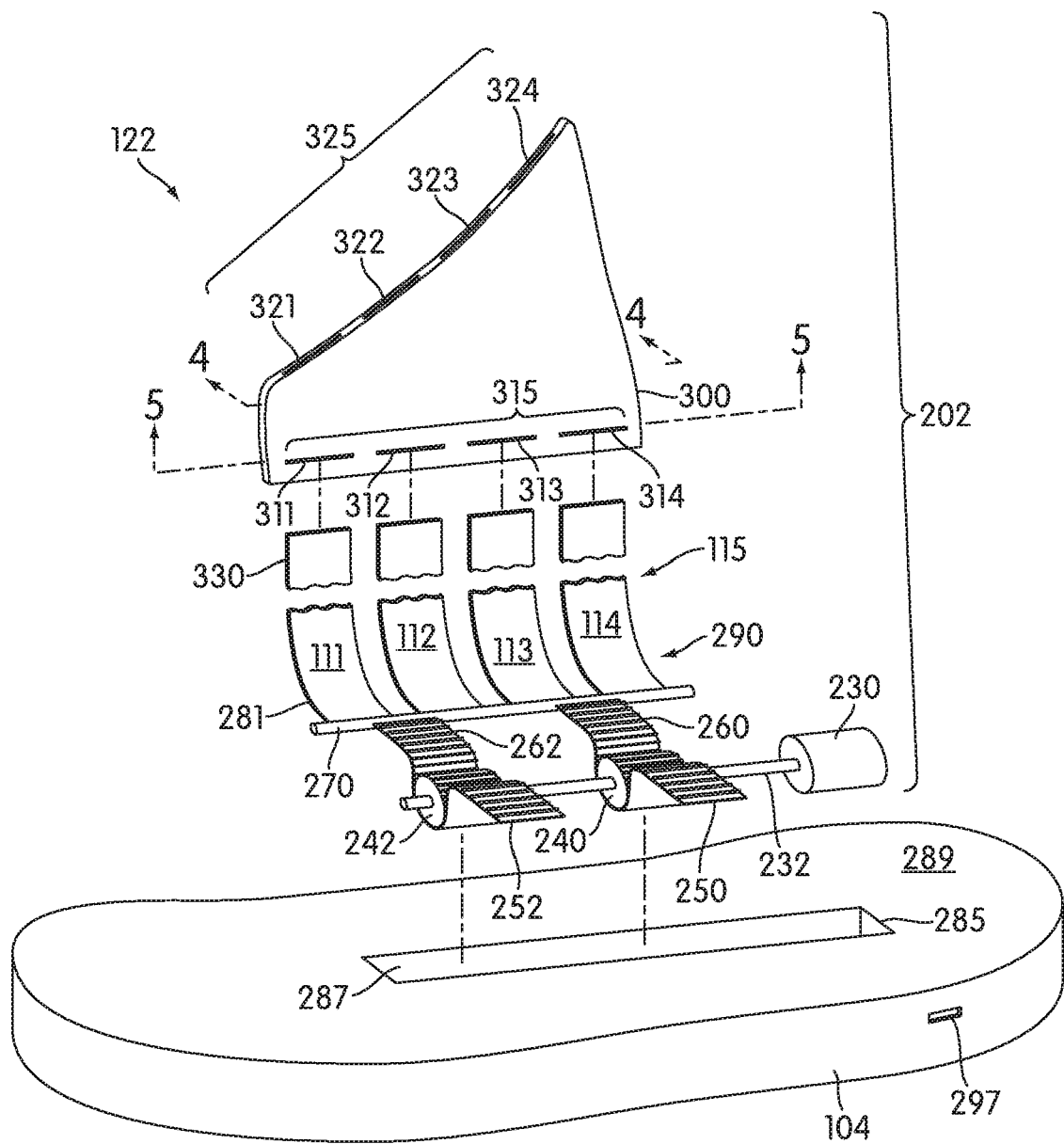
FIG. 3 is an exploded isometric view of an embodiment of a lacing system.

FIG. 2 illustrates an assembled isometric view and FIG. 3 illustrates an exploded isometric view, respectively, of first lacing system 122. For purposes of clarity, a portion of upper 102 has been cut away in FIG. 2. As previously discussed, first lacing system 122 may include first strap set 115. In one embodiment, first lacing system 122 also includes provisions for moving first strap set 115. In the embodiment of FIGS. 2-5, first lacing system 122 preferably includes a fastener moving mechanism 202. The term "fastener moving mechanism" as used throughout this detailed description and in the claims refers to any mechanism capable of providing motion to one or more tensile elements without requiring work to be performed by the user.

In some embodiments, fastener moving mechanism 202 includes provisions for powering first lacing system 122. Generally, any type of power source can be utilized. Various types of power sources include, but are not limited to, electrical power sources, mechanical power sources, chemical power sources, as well as other types of power sources. In some embodiments, fastener moving mechanism 202 includes a motor 230. Motor 230 could be any type of motor, including, but not limited to, an electric motor, an electrostatic motor, a pneumatic motor, a hydraulic motor, a fuel powered motor or any other type of motor. In one embodiment, motor 230 is an electric motor that transforms electrical energy into mechanical energy.

Generally, motor 230 may be associated with an electrical power source of some kind. In some cases, motor 230 could be associated with an external battery. In still other cases, motor 230 could include an internal battery. In one embodiment, motor 230 may be configured to receive power from a battery 299. Battery 299 could be any type of battery. In some embodiments, battery 299 could be a disposable battery. Examples of different types of disposable batteries include, but are not limited to, zinc-carbon, zinc-chloride, alkaline, silver-oxide, lithium disulfide, lithium-thionyl chloride, mercury, zinc-air, thermal, water-activated, nickel oxyhydroxide, and paper batteries. In one embodiment, battery 299 could be a rechargeable battery of some kind. Examples of rechargeable batteries include, but are not limited to nickel-cadmium, nickel-metal hydride and rechargeable alkaline batteries.

Generally, battery 299 could be disposed in any portion of article 100. In some embodiments, battery 299 could be associated with an ankle cuff of article 100. In other embodiments, battery 299 could be disposed in another portion of upper 102. In one embodiment, battery 299 may be disposed in a portion of sole structure 104. This arrangement in some embodiments helps to protect battery 299 from the elements and direct contact with a foot of the wearer.

Generally, the size of battery 299 may vary. In some embodiments, battery 299 could have a length in the range of 10 mm to 50 mm. Furthermore, battery 299 could have a width in the range of 10 mm to 50 mm. In one embodiment, battery 299 has a width of about 30 mm. Furthermore, battery 299 in some embodiments has a length of about 40 mm.

In some embodiments, article 100 may include provisions for recharging battery. In some cases, an inductive charger may be used. In other cases, a USB-based charger may be used. In still other cases, other types of charging provisions can be used. In one embodiment, sole structure 104 includes a charging port 297. In this embodiment, charging port 297 may be a mini-USB type charging port. Furthermore, charging port 297 may be electrically connected with battery 299 via an electrical circuit of some kind. In some embodiments, charging port 297 can be coupled to a battery charger of some kind. With this arrangement, power can be transferred to battery 299 from an external power source in order to recharge battery 299.

Motor 230 may be connected to a driveshaft 232. In particular, motor 230 is in some embodiments configured to provide torque to driveshaft 232 to rotate driveshaft 232. Furthermore, driveshaft 232 may include one or more gears for transferring power to first strap set 115. In one embodiment, driveshaft 232 may include first gear 240 and second gear 242.

In some embodiments, fastener moving mechanism 202 may include one or more belts for transferring power to first strap set 115. In this embodiment, fastener moving mechanism 202 may include a first belt 250 and a second belt 252. In some embodiments, first belt 250 and second belt 252 are configured to engage with first gear 240 and second gear 242, respectively. In one embodiment, first belt 250 and second belt 252 are serpentine belts that move laterally with respect to sole structure 104 as first gear 240 and second gear 242 are rotated.

In some embodiments, first belt 250 and second belt 252 may be attached to a yoke member that is associated with first strap set 115. In this embodiment, a first attachment portion 260 of first belt 250 may be attached directly to a yoke member 270. Also, a second attachment portion 262 of second belt 252 may be attached directly to yoke member 270.

In some embodiments, each tensile element of first strap set 115 is also directly attached to yoke member 270. In this embodiment, first end portion 281 of first strap 111 is attached to yoke member 270. Likewise second strap 112, third strap 113 and fourth strap 114 are in some embodiments attached to yoke member 270 at similar end portions. This arrangement provides for a yoking configuration of first strap 111, second strap 112, third strap 113 and fourth strap 114. With this arrangement, first strap 111, second strap 112, third strap 113 and fourth strap 114 may move substantially in unison at first end portion 290 of first strap set 115. This in some embodiments allows the tightening and loosening of upper 102 to be applied evenly over arch portion 130 of upper 102.

Generally, yoke member 270 could be any type of yoke. In some embodiments, yoke member 270 could be a curved yoke. For example, in some cases yoke member 270 could be a bow yoke. In other embodiments, yoke member 270 may be substantially straight. In one embodiment, yoke member 270 has an approximately cylindrical bar or rod shape. With this arrangement, multiple tensile elements may be connected along the entirety of the length of yoke member 270 in a generally parallel manner.

In some embodiments, article 100 includes provisions for receiving one or more components of fastener moving mechanism 202. In some embodiments, one or more components of fastener moving mechanism 202 may be disposed within upper 102. In other embodiments, one or more components of fastener moving mechanism 202 may be disposed within sole structure 104. In one embodiment, sole structure 104 may include an interior cavity that is configured to receive multiple components of fastener moving mechanism 202.

Referring to FIGS. 2 and 3, sole structure 104 in some embodiments includes an interior cavity 1285. Generally, interior cavity 285 may have any shape. Examples of different shapes include, but are not limited to, circular shapes, oval shapes, square shapes, rectangular shapes, polygonal shapes, regular shapes, irregular shapes as well as other kinds of shapes. In this exemplary embodiment, interior cavity 285 has a generally rectangular shape.

Interior cavity 285 is in some embodiments configured to receive motor 230. Additionally, interior cavity 285 may be configured to receive driveshaft 232, including first gear 240 and second gear 242. In particular, interior cavity 285 may provide room for rotation of driveshaft 232, first gear 240 and second gear 242.

In some embodiments, interior cavity 285 may be disposed internally within sole structure 104. In other words, interior cavity 285 may be disposed below an upper surface of sole structure 104. In other embodiments, interior cavity 285 may be open at the upper surface of sole structure 104. In other words, interior cavity 285 may be in fluid communication with an interior portion of upper 102.

In the current embodiment, interior cavity 285 includes an upper opening 287 that is disposed on an upper surface 289 of sole structure 104. In other words, interior cavity 285 is a recessed portion of upper surface 289. In some embodiments, upper surface 289 of sole structure 104 may be covered by an insole to separate interior cavity 285 from a foot receiving cavity 291 of upper 102. With this arrangement, a foot may be prevented from contacting, and potentially interfering with, one or more components of fastener moving mechanism 202 that may be disposed within interior cavity 285.

In some embodiments, first lacing system 122 also includes provisions for guiding first strap set 115 within upper 102, also referred to as a guide element. A guide element may provide a mechanism for routing and/or facilitating the motion of tensile elements through upper 102. In the embodiment of FIG. 3, first lacing system 122 may include guide element such as a hollow plate 300. In this embodiment, hollow plate 300 may be associated with a first sidewall portion 302 of upper 102. In some embodiments, hollow plate 300 may be disposed against an inner surface of first sidewall portion 302. In other embodiments, hollow plate 300 may be disposed against an outer surface of first sidewall portion 302. In one embodiment, hollow plate 300 may be integral with first sidewall portion 302. In other words, hollow plate 300 may be disposed between an inner lining and an outer lining of upper 102 to provide rigid support at first sidewall portion 302. In some embodiments, hollow plate 300 may include a greater rigidity than the rigidity of first sidewall portion 302 of upper 102. In other embodiments where hollow plate 300 is disposed elsewhere along upper 102, hollow plate 300 may include a greater rigidity of the portion of upper 102 it is adjacent to. In addition, as noted above, in some embodiments, hollow plate 300 may have a rigidity that is greater relative to the rigidity of the tensile elements that hollow plate 300 is associated with.

Referring to FIG. 3, hollow plate 300 may include openings for receiving straps into, and releasing straps from, a hollow cavity of hollow plate 300. In this embodiment, hollow plate 300 includes a first lower opening 311, a second lower opening 312, a third lower opening 313 and a fourth lower opening 314, referred to collectively as a first lower opening set 315. Additionally, hollow plate 300 may include a first upper opening 321, a second upper opening 322, a third upper opening 323 and a fourth upper opening 324, referred to collectively as a first upper opening set 325.

As illustrated in FIG. 3, a second end portion 330 of first strap 111 may be inserted into hollow plate 300 at first lower opening 311 and may exit from hollow plate 300 at first upper opening 321. In some embodiments, the second portions of second strap 112, third strap 113 and fourth strap 114 may be similarly inserted into second lower opening 312, third lower opening 313 and fourth lower opening 314, respectively. Likewise, the second end portions of second strap 112, third strap 113 and fourth strap 114 may exit from hollow plate 300 at second upper opening 322, third upper opening 323 and fourth upper opening 324, respectively. With this arrangement, hollow plate 300 may serve as a guide for first strap set 115. In some embodiments, hollow plate 300 helps reduce friction between the straps of first strap set 115 and upper 102 that might otherwise inhibit motion of the straps. Thus, hollow plate 300 can be configured to receive an intermediate portion of the straps.

Generally, hollow plate 300 could have any shape. In some embodiments, hollow plate 300 may be generally flat. In one embodiment, hollow plate 300 may vary in height along different portions. In other embodiments, hollow plate 300 could be curved. In one embodiment, hollow plate 300 could have a curved shape that substantially matches the contours of first sidewall portion 302. Furthermore, hollow plate 300 in some embodiments extends from sole structure 104 to the top of first sidewall portion 302. With this arrangement, hollow plate 300 may help guide first strap set 115 through the interior of upper 102.

Generally, hollow plate 300 could have any thickness. In some embodiments, hollow plate 300 could have a thickness much greater than the lining of upper 102. In other embodiments, hollow plate 300 could have a thickness that is substantially less than the lining of upper 102. In one embodiment, hollow plate 300 has a thickness that is substantially similar to the thickness of the lining of upper 102. With this arrangement, hollow plate 300 in some embodiments does not substantially interfere with the motion and flexibility of upper 102 at first sidewall portion 302.

Figure 4:
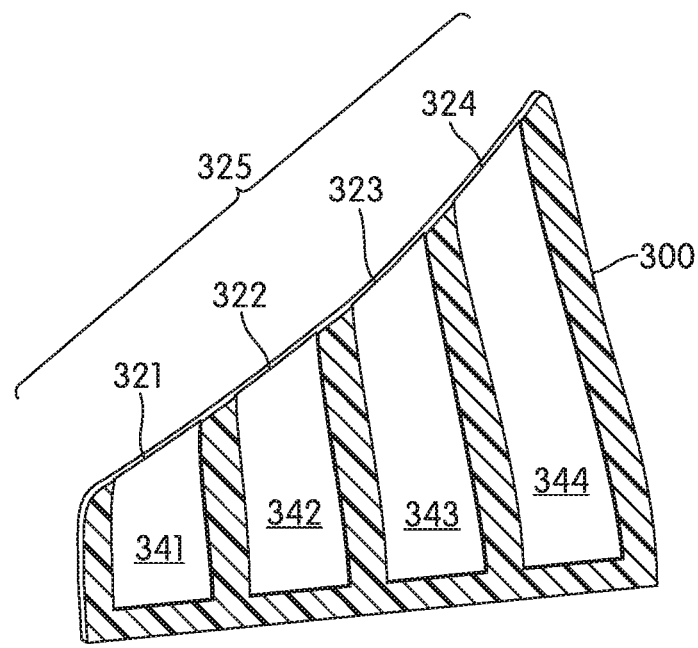
FIG. 4 is a cross sectional view of an embodiment of a hollow plate.

FIG. 4 is a cross sectional view of an embodiment of the interior of hollow plate 300 along the lateral direction, as indicated in FIG. 3. Referring to FIG. 4, hollow plate 300 may include individual passages for receiving each strap of first strap set 115. In the different embodiments disclosed herein, passages may be substantially hollow, or they may include portions of tensile elements. In this embodiment, hollow plate 300 includes a first strap receiving passage 341, a second strap receiving passage 342, a third strap receiving passage 343 and a fourth strap receiving passage 344 that are configured to receive first strap 111, second strap 112, third strap 113 and fourth strap 114, respectively. Straps may exit or enter from first upper opening 321, second upper opening 322, third upper opening 323 and fourth upper opening 324.

Generally, hollow plate 300 could have passages of any shape. In the current embodiment, first strap receiving passage 341, second strap receiving passage 342, third strap receiving passage 343 and fourth strap receiving passage 344 have a slightly curved shape since hollow plate 300 has an approximately curved shape. However, in other embodiments, the passages of a hollow plate could also be approximately straight.

Figure 5:
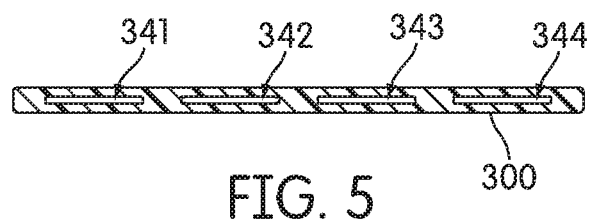
FIG. 5 is a cross sectional view of an embodiment of a hollow plate.

FIG. 5 is a cross sectional view of an embodiment of the interior of hollow plate 300 in the longitudinal direction, as indicated in FIG. 3. Referring to FIG. 5, the individual passages shown in FIG. 4 are shown in a lateral cross-section. FIG. 5 illustrates a cross-section of first strap receiving passage 341, second strap receiving passage 342, third strap receiving passage 343 and fourth strap receiving passage 344 that are configured to receive first strap 111, second strap 112, third strap 113 and fourth strap 114 (shown in FIG. 3), respectively.

In some embodiments, the strap receiving passages could be much larger than the straps of first strap set 115. In one embodiment, the dimensions of first strap receiving passage 341, second strap receiving passage 342, third strap receiving passage 343 and fourth strap receiving passage 344 are substantially similar to the dimensions of the straps of first strap set 115. With this arrangement, first strap receiving passage 341, second strap receiving passage 342, third strap receiving passage 343 and fourth strap receiving passage 344 may be configured as guides that allow for a smooth sliding movement of each strap through hollow plate 300 without allowing for unwanted bending, twisting or other modes of motion that may inhibit this smooth sliding movement. For example, if the strap receiving passages are too large, the strap may bunch or fold within the strap receiving passage rather than slide through the strap receiving passage smoothly. In another example, if the lace receiving passages are too narrow, the lace may experience increased friction and/or erratic movement through the passages.

In the embodiment of FIGS. 6-9, a second lacing system 623 is shown. Second lacing system 623 includes four tensile elements, including a first strap 611, a second strap 612, a third strap 613 and a fourth strap 614. For clarity, first strap 611, second strap 612, third strap 613 and fourth strap 614 may be referred to collectively as a second strap set 615. It should be understood that in other embodiments, first strap set 115 may include any type of tensile element, as described above.

Figure 6:
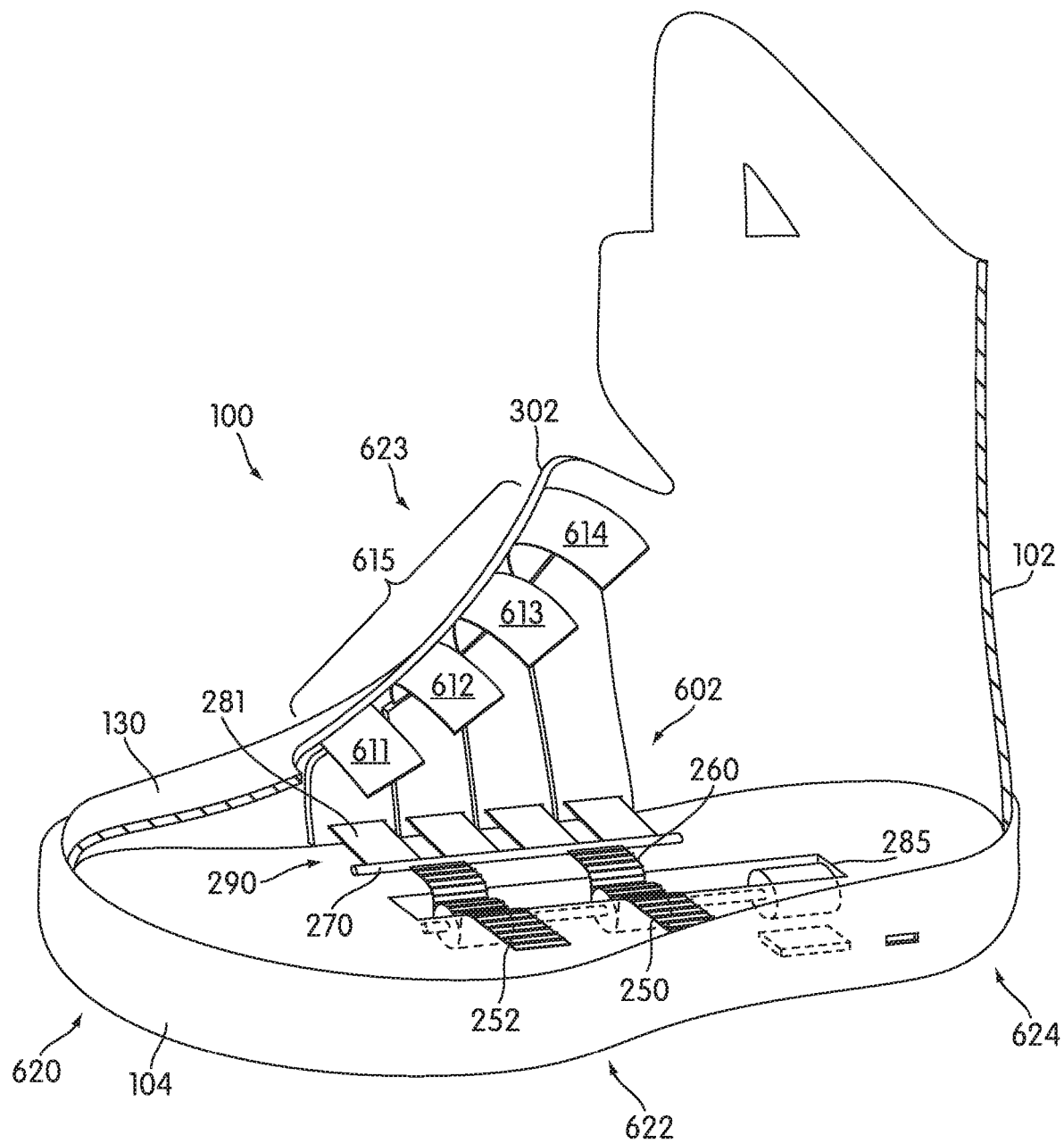
FIG. 6 is a side cross sectional view of an embodiment of an article of footwear including a lacing system.
Figure 7:
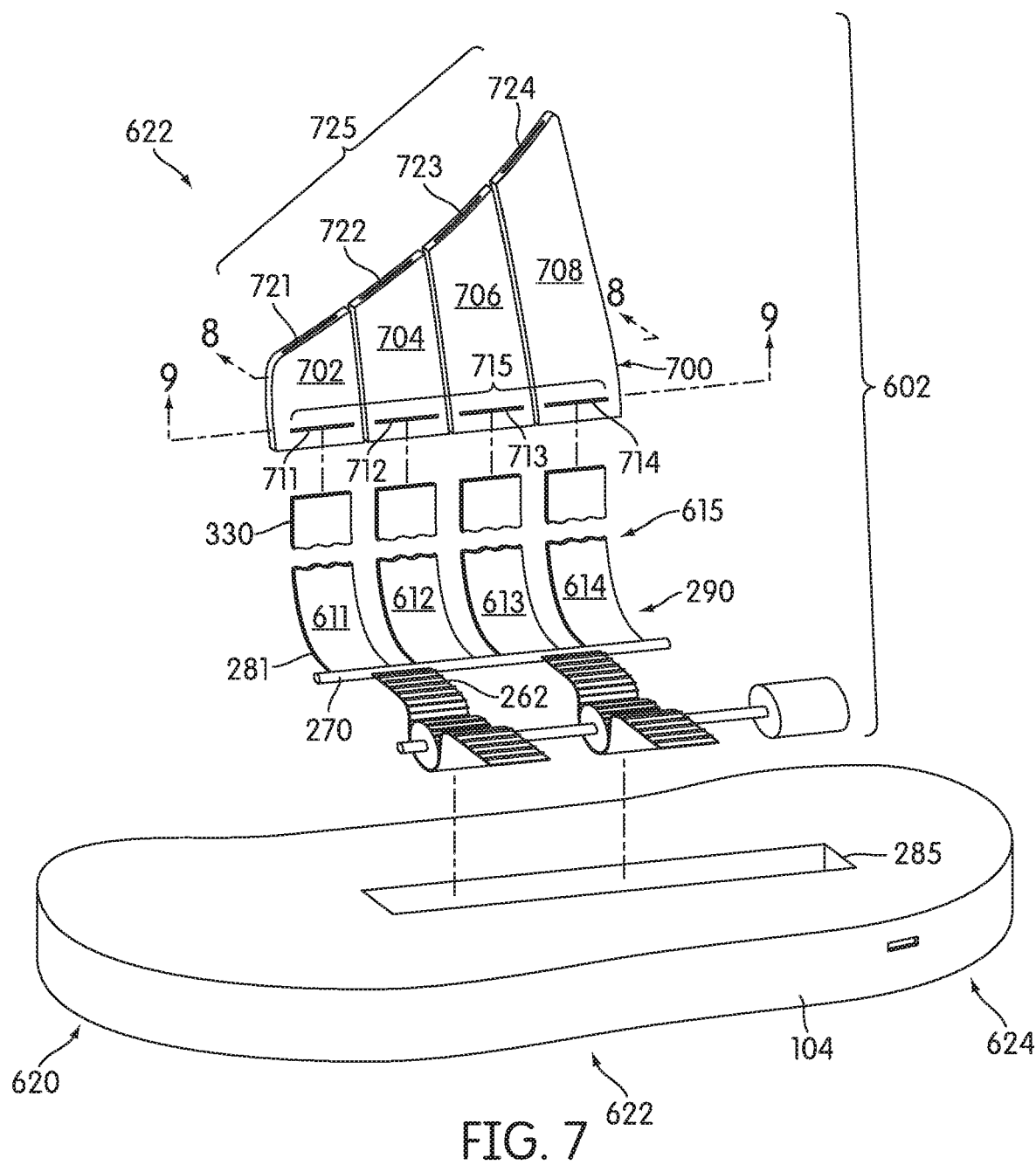
FIG. 7 is an exploded isometric view of an embodiment of a lacing system.

FIGS. 6-9 are intended to illustrate in detail some of the individual components and operation of second lacing system 623. FIG. 6 illustrates an assembled isometric view and FIG. 7 illustrates an exploded isometric view, respectively, of second lacing system 623. For purposes of clarity, a portion of upper 102 has been cut away in FIG. 6. As previously discussed, second lacing system 623 may include second strap set 615.

It should be understood that in the embodiments described below, the lacing systems may incorporate, include, or comprise one or more provisions for moving or interacting with tensile elements such as discussed with reference to FIGS. 1-5. For example, in the embodiment illustrated in FIG. 6, second lacing system 623 includes a fastener moving mechanism 602. In still other embodiments, each of the lacing systems disclosed herein may include one or more belts, gears, or yoke members. Furthermore, sole structure 104 may include an interior cavity, or one or more motors, driveshafts, batteries, and other components or structural variations as described with respect to FIGS. 1-5.

Thus, as shown in FIG. 7, in some embodiments, first belt 250 and second belt 252 may be attached to a yoke member that is associated with second strap set 615. In this embodiment, first attachment portion 260 of first belt 250 may be attached directly to yoke member 270. Also, second attachment portion 262 of second belt 252 may be attached directly to yoke member 270.

In one embodiment, each strap of second strap set 615 is also directly attached to yoke member 270. In the embodiment of FIG. 6, first end portion 281 of first strap 611 is attached to yoke member 270. Likewise second strap 612, third strap 613 and fourth strap 614 are attached to yoke member 270 at similar end portions. This arrangement provides for a yoking configuration of first strap 611, second strap 612, third strap 613 and fourth strap 614. With this arrangement, first strap 611, second strap 612, third strap 613 and fourth strap 614 may move substantially in unison at first end portion 290 of second strap set 615. In some embodiments, this can allow the tightening and loosening of upper 102 to be applied evenly over arch portion 130 of upper 102.

In one embodiment, article 100 includes provisions for receiving one or more components of fastener moving mechanism 202, as described above with respect to FIGS. 1-5. Furthermore, second lacing system 623 can also include provisions for guiding second strap set 615 within upper 102. In the embodiment of FIG. 7, second lacing system 623 may include a guide element such as a hollow plate set 700. In some embodiments, hollow plate set 700 may comprise a series of segmented portions, similar to the segmentation of hollow plate 300 in FIG. 3. As shown in FIG. 7, hollow plate set 700 comprises a first hollow plate 702, a second hollow plate 704, a third hollow plate 706, and a fourth hollow plate 708.

In this embodiment, hollow plate set 700 may be associated with first sidewall portion 302 of upper 102, as shown in FIG. 6. In some embodiments, hollow plate set 700 may be disposed against an inner surface of first sidewall portion 302. In other embodiments, hollow plate set 700 may be disposed against an outer surface of first sidewall portion 302. In one embodiment, hollow plate set 700 may be integral with first sidewall portion 302. In other words, hollow plate set 700 may be disposed between an inner lining and an outer lining of upper 102 to provide rigid support at first sidewall portion 302. In some embodiments, hollow plate set 700 may include a greater rigidity than the rigidity of first sidewall portion 302 of upper 102. In other embodiments where hollow plate set 700 is disposed elsewhere along upper 102, hollow plate set 700 may include a greater rigidity of the portion of upper 102 it is adjacent to. In addition, as noted above, in some embodiments, hollow plate set 700 may have a rigidity that is greater relative to the rigidity of the tensile elements that hollow plate set 700 is associated with.

Referring to FIG. 7, each of first hollow plate 702, second hollow plate 704, third hollow plate 706, and fourth hollow plate 708 may include openings for receiving straps into, and releasing straps from, a hollow cavity. In the embodiment of FIGS. 6-9, first hollow plate 702 includes a first lower opening 711, second hollow plate 704 includes a second lower opening 712, third hollow plate 706 includes a third lower opening 713 and fourth hollow plate 708 includes a fourth lower opening 714, referred to collectively as a second lower opening set 715. Additionally, first hollow plate 702 includes a first upper opening 721, second hollow plate 704 includes a second upper opening 722, third hollow plate 706 includes a third upper opening 723 and fourth hollow plate 708 includes a fourth upper opening 724, referred to collectively as a second upper opening set 725.

As illustrated in FIG. 7, a second end portion 330 of first strap 611 may be inserted into first hollow plate 702 at first lower opening 711 and may exit from first hollow plate 702 at first upper opening 721. In some embodiments, the second portions of second strap 612, third strap 613 and fourth strap 614 may be similarly inserted into second lower opening 712, third lower opening 713 and fourth lower opening 714, respectively. Likewise, the second end portions of second strap 612, third strap 613 and fourth strap 614 may exit from each of the hollow plates of hollow plate set 700 at second upper opening 722, third upper opening 723 and fourth upper opening 724, respectively. With this arrangement, each hollow plate of hollow plate set 700 may serve as a guide for second strap set 615. Thus, in some embodiments, first hollow plate 702, second hollow plate 704, third hollow plate 706, and fourth hollow plate 708 help reduce friction between the straps of second strap set 615 and upper 102 that might otherwise inhibit motion of the straps. Thus, hollow plate set 700 can be configured to receive an intermediate portion of the straps.

Generally, each of the hollow plates in hollow plate set 700 could have any shape. For example, in some embodiments, first hollow plate 702 may be generally flat. In one embodiment, first hollow plate 702 may be substantially rectangular, or strip-like. In other embodiments, first hollow plate 702 could be curved. In one embodiment, first hollow plate 702 could have a curved shape that substantially matches the contours of first sidewall portion 302. Furthermore, first hollow plate 702 may extend from sole structure 104 to the top of first sidewall portion 302. With this arrangement, first hollow plate 702 may help guide second strap set 615 through the interior of upper 102.

It should be noted that in some embodiments, first hollow plate 702 may match the contours of first sidewall portion 302 that it is adjacent to. Thus, as first sidewall portion 302 of upper 102 may curve upward and increase in height from a forefoot region 620 toward a midfoot region 622, and/or from midfoot region 622 to a heel region 624, first hollow plate 702, second hollow plate 704, third hollow plate 706, and fourth hollow plate 708 may increase in height to follow the contours of first sidewall portion 302. Such a design may enhance the ability of hollow plate set 700 to serve as a guide for second strap set 615, as straps are routed through fastener moving mechanism 602. Variations in the curvature of the structure of the hollow plates will be discussed further below with reference to FIGS. 18-20.

In other embodiments, there may be fewer hollow plates or a greater number of hollow plates in hollow plate set 700. For example, in one embodiment there may be three or less hollow plates. In another embodiment, there may be five or more hollow plates. As will be discussed further below with reference to FIGS. 18-20, there may also be embodiments where only a single hollow plate is incorporated into an article of footwear. Furthermore, it should be understood that in other embodiments, the hollow plates may be disposed along different regions of an article of footwear. For example, referring to FIG. 6, one or more hollow plates may instead be located along forefoot region 620, midfoot region 622, and/or heel region 624 of upper 102.

Generally, each hollow plate of hollow plate set 700 could have any thickness. For example, in some embodiments, first hollow plate 702 could have a thickness much greater than the lining of upper 102. In other embodiments, first hollow plate 702 could have a thickness that is substantially less than the lining of upper 102. In one embodiment, first hollow plate 702 has a thickness that is substantially similar to the thickness of the lining of upper 102. With this arrangement, first hollow plate 702 may not substantially interfere with the motion and flexibility of upper 102 at first sidewall portion 302.

Figure 8:
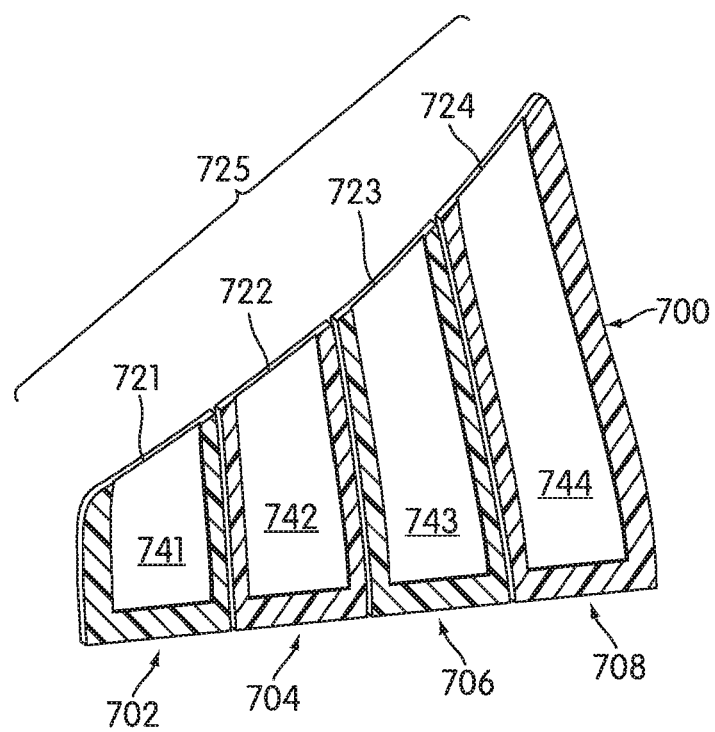
FIG. 8 is a cross sectional view of an embodiment of a segmented hollow plate.

FIG. 8 is a cross sectional view of an embodiment of the interior of hollow plate set 700 along the lateral direction, as shown in FIG. 7. Referring to FIG. 8, hollow plate set 700 includes individual passages along each hollow plate for receiving each strap of second strap set 615. In this embodiment, hollow plate set 700 includes a first strap receiving passage 741 in first hollow plate 702, a second strap receiving passage 742 in second hollow plate 704, a third strap receiving passage 743 in third hollow plate 706, and a fourth strap receiving passage 744 in fourth hollow plate 708. Each strap receiving passage is configured to receive first strap 611, second strap 612, third strap 613 and fourth strap 614, respectively. Straps may exit or enter from first upper opening 721, second upper opening 722, third upper opening 723 and fourth upper opening 724.

Generally, as discussed with respect to hollow plate 300 of FIGS. 2-5, hollow plate set 700 could have passages of any shape. In the current embodiment, first strap receiving passage 741, second strap receiving passage 742, third strap receiving passage 743 and fourth strap receiving passage 744 have a slightly curved shape since first hollow plate 702, second hollow plate 704, third hollow plate 706, and fourth hollow plate 708 each have an approximately curved shape. However, in other embodiments, the passages of a hollow plate set could also be approximately straight.

Figure 9:
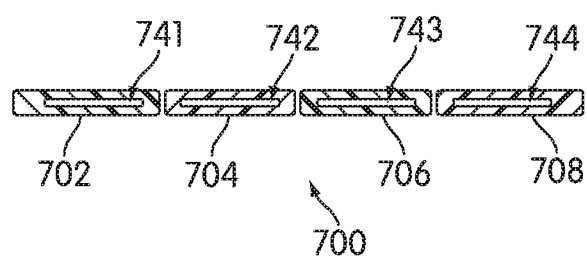
FIG. 9 is a cross sectional view of an embodiment of a segmented hollow plate.

FIG. 9 is a cross sectional view of an embodiment of the interior of hollow plate set 700 in the longitudinal direction, as indicated in FIG. 7. Referring to FIG. 9, the individual passages shown in FIG. 8 are shown in a longitudinal cross-section. FIG. 9 illustrates first strap receiving passage 741, second strap receiving passage 742, third strap receiving passage 743 and fourth strap receiving passage 744 that are configured to receive first strap 611, second strap 612, third strap 613 and fourth strap 614 (shown in FIG. 7), respectively.

In some embodiments, the strap receiving passages of hollow plate set 700 could be much larger than the straps of second strap set 615. In one embodiment, the dimensions of first strap receiving passage 741, second strap receiving passage 742, third strap receiving passage 743 and fourth strap receiving passage 744 are substantially similar to the dimensions of the straps of second strap set 615. Thus, with this arrangement, first strap receiving passage 741, second strap receiving passage 742, third strap receiving passage 743 and fourth strap receiving passage 744 may be configured as guides that allow for a smooth sliding movement of each strap through hollow plate set 700 without allowing for unwanted bending, twisting or other modes of motion that may inhibit this smooth sliding movement. For example, as noted above, if the strap receiving passages are too large, the strap may bunch or fold within the strap receiving passage rather than slide through the strap receiving passage smoothly. Furthermore, if the lace receiving passages are too narrow, the lace may experience increased friction and/or erratic movement through the passages. In addition, in one embodiment, by increasing the degree of segmentation between adjacent strap receiving passages, hollow plate set 700 can allow for more flexibility along sidewall portion 302 (or the portion of upper 102 in which hollow plate set 700 is incorporated) as the channels are provided with space to bend or curve.

In the embodiment of FIGS. 10-13, a third lacing system 1022 is shown. Third lacing system 1022 includes six tensile elements, including a first strap 1011, a second strap 1012, a third strap 1013, a fourth strap 1014, a fifth strap 1016, and a sixth strap 1017. For clarity, first strap 1011, second strap 1012, third strap 1013, fourth strap 1014, fifth strap 1016, and sixth strap 1017 may be referred to collectively as a first strap set 1015. It should be understood that in other embodiments, first strap set 1015 may include any type of tensile element, as described above.

Figure 10:
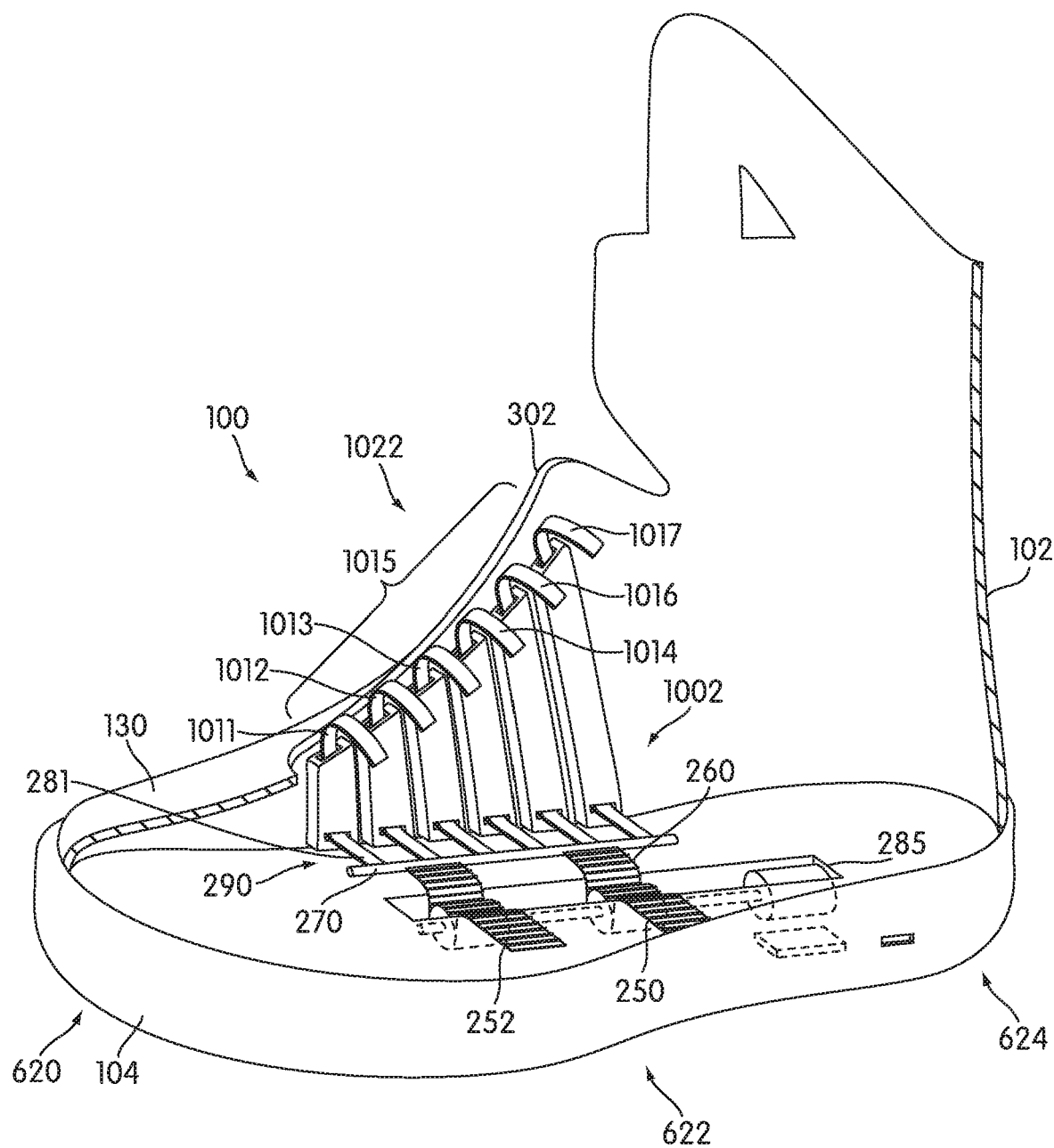
FIG. 10 is a side cross sectional view of an embodiment of an article of footwear including a lacing system.
Figure 11:
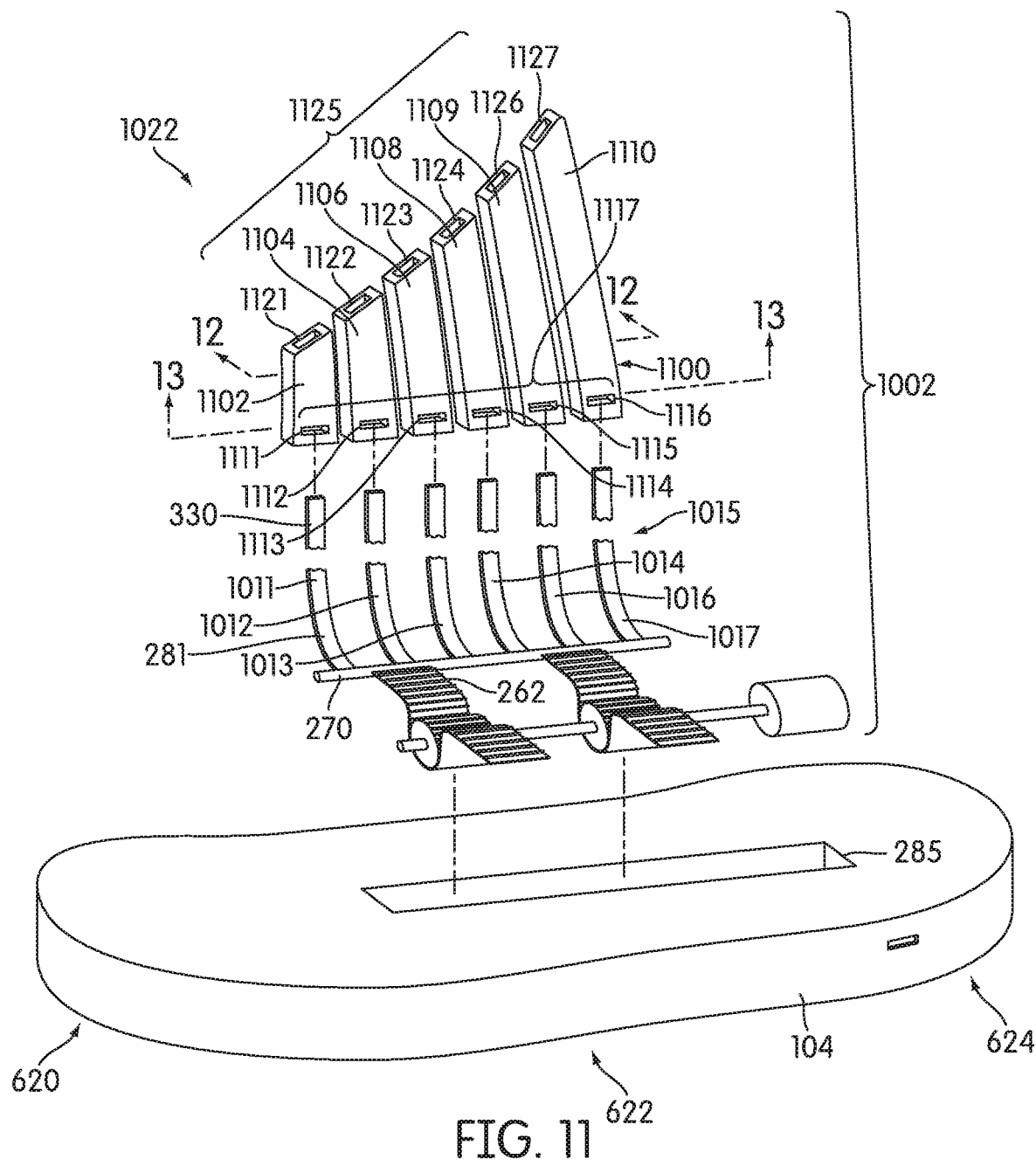
FIG. 11 is an exploded isometric view of an embodiment of a lacing system.

FIGS. 10-13 are intended to illustrate in detail some of the individual components and operation of third lacing system 1022. FIG. 10 illustrates an assembled isometric view and FIG. 11 illustrates an exploded isometric view, respectively, of third lacing system 1022. For purposes of clarity, a portion of upper 102 has been cut away in FIG. 10. As previously discussed, third lacing system 1022 may include first strap set 1015.

It should be understood that in the embodiments described below, the lacing systems may incorporate, include, or comprise one or more provisions for moving or interacting with tensile elements such as discussed with reference to FIGS. 1-9. For example, in the embodiment illustrated in FIG. 10, third lacing system 1022 includes a fastener moving mechanism 1002. In still other embodiments, some of the lacing systems disclosed herein may include one or more belts, gears, or yoke members. Furthermore, sole structure 104 may include an interior cavity, or one or more motors, driveshafts, batteries, and other components or structural variations as described with respect to FIGS. 1-9.

Thus, in some embodiments, first belt 250 and second belt 252 may be attached to a yoke member that is associated with second strap set 615. In this embodiment, first attachment portion 260 of first belt 250 may be attached directly to yoke member 270. Also, second attachment portion 262 of second belt 252 may be attached directly to yoke member 270.

In one embodiment, each lace of first strap set 1015 is also directly attached to yoke member 270. In the embodiment of FIG. 10, first end portion 281 of first strap 1011 is attached to yoke member 270. Likewise second strap 1012, third strap 1013, fourth strap 1014, fifth strap 1016, and sixth strap 1017 are attached to yoke member 270 at similar end portions. This arrangement provides for a yoking configuration of first strap 1011, second strap 1012, third strap 1013, fourth strap 1014, fifth strap 1016, and sixth strap 1017. With this arrangement, first strap 1011, second strap 1012, third strap 1013, fourth strap 1014, fifth strap 1016, and sixth strap 1017 may move substantially in unison at first end portion 290 of first strap set 1015. In some embodiments, this can allow the tightening and loosening of upper 102 to be applied evenly over arch portion 130 of upper 102.

In one embodiment, article 100 includes provisions for receiving one or more components of fastener moving mechanism 1002, as also described above with respect to FIGS. 1-9. Furthermore, third lacing system 1022 can also include provisions for guiding first strap set 1015 within upper 102. In the embodiment of FIG. 11, third lacing system 1022 may include a guide element such as a hollow channel set 1100. Hollow channel set 1100 may comprise a first hollow channel 1102, a second hollow channel 1104, a third hollow channel 1106, a fourth hollow channel 1108, a fifth hollow channel 1109, and a sixth hollow channel 1110. In other embodiments, there may be fewer hollow channels or a greater number of hollow channels in hollow channel set 1100. For example, in one embodiment there may be three or less hollow channels. In another embodiment, there may be five or more hollow channels.

In this embodiment, hollow channel set 1100 may be associated with first sidewall portion 302 of upper 102, as shown in FIG. 10. In some embodiments, hollow channel set 1100 may be disposed against an inner surface of first sidewall portion 302. In other embodiments, hollow channel set 1100 may be disposed against an outer surface of first sidewall portion 302. In one embodiment, hollow channel set 1100 may be integral with first sidewall portion 302. In other words, hollow channel set 1100 may be disposed between an inner lining and an outer lining of upper 102 to provide rigid support at first sidewall portion 302. In some embodiments, hollow channel set 1100 may include a greater rigidity than the rigidity of first sidewall portion 302 of upper 102. In other embodiments where hollow channel set 1100 is disposed elsewhere along upper 102, hollow channel set 1100 may include a greater rigidity of the portion of upper 102 it is adjacent to. In addition, as noted above, in some embodiments, hollow channel set 1100 may have a rigidity that is greater relative to the rigidity of the tensile elements that hollow channel set 1100 is associated with.

Referring to FIG. 11, each of first hollow channel 1102, second hollow channel 1104, third hollow channel 1106, fourth hollow channel 1108, fifth hollow channel 1109, and sixth hollow channel 1110 may include openings for receiving laces into, and releasing laces from, a hollow cavity. In the embodiment of FIGS. 10-13, first hollow channel 1102 includes a first lower opening 1111, second hollow channel 1104 includes a second lower opening 1112, third hollow channel 1106 includes a third lower opening 1113, fourth hollow channel 1108 includes a fourth lower opening 1114, fifth hollow channel 1109 includes a fifth lower opening 1115, and sixth hollow channel 1110 includes a sixth lower opening 1116, referred to collectively as a third lower opening set 1117. Additionally, first hollow channel 1102 includes a first upper opening 1121, second hollow channel 1104 includes a second upper opening 1122, third hollow channel 1106 includes a third upper opening 1123, fourth hollow channel 1108 includes a fourth upper opening 1124, fifth hollow channel 1109 includes a fifth upper opening 1126, and sixth hollow channel 1110 includes a sixth upper opening 1127, referred to collectively as a third upper opening set 1125.

As illustrated in FIG. 11, a second end portion 330 of first strap 1011 may be inserted into first hollow channel 1102 at first lower opening 1111 and may exit from first hollow channel 1102 at first upper opening 1121. In some embodiments, the second portions of second strap 1012, third strap 1013, fourth strap 1014, fifth strap 1016, and sixth strap 1017 may be similarly inserted into second lower opening 1112, third lower opening 1113, fourth lower opening 1114, fifth lower opening 1115, and sixth lower opening 1116, respectively. Likewise, the second end portions of second strap 1012, third strap 1013, fourth strap 1014, fifth strap 1016, and sixth strap 1017 may exit from each of the hollow channels of hollow channel set 1100 at second upper opening 1122, third upper opening 1123, fourth upper opening 1124, fifth upper opening 1125, and sixth upper opening 1126, respectively. With this arrangement, each hollow channel of hollow channel set 1100 may serve as a guide for first strap set 1015. Thus, in some embodiments, first hollow channel 1102, second hollow channel 1104, third hollow channel 1106, fourth hollow channel 1108, fifth hollow channel 1109, and sixth hollow channel 1110 help reduce friction between the laces of first strap set 1015 and upper 102 that might otherwise inhibit motion of the laces. Thus, hollow channel set 1100 can be configured to receive an intermediate portion of the laces.

Generally, each of the hollow channels in hollow channel set 1100 could have any shape. For example, in some embodiments, first hollow channel 1102 may be generally flat. In one embodiment, first hollow channel 1102 may be similar to a rectangular or square cylinder, or a rectangular prism. In other embodiments, first hollow channel 1102 could be curved. In one embodiment, first hollow channel 1102 could have a curved shape that substantially matches the contours of first sidewall portion 302. Furthermore, first hollow channel 1102 may extend from sole structure 104 to the top of first sidewall portion 302. With this arrangement, first hollow channel 1102 may help guide first strap set 1015 through the interior of upper 102.

It should be noted that in some embodiments, first hollow channel 1102 may match the contours of first sidewall portion 302 that it is adjacent to. Thus, as first sidewall portion 302 of upper 102 may curve upward and increase in height from a forefoot region 620 toward a midfoot region 622, and/or from midfoot region 622 to heel region 624, first hollow channel 1102, second hollow channel 1104, third hollow channel 1106, fourth hollow channel 1108, fifth hollow channel 1109, and sixth hollow channel 1110 may increase in height to follow the contours of first sidewall portion 302. Such a design may enhance the ability of hollow channel set 1100 to serve as a guide for first strap set 1015, as laces are routed through fastener moving mechanism 1002.

In other embodiments, there may be fewer hollow channels or a greater number of hollow channels in hollow channel set 1100. For example, in one embodiment there may be three or less hollow channels. In another embodiment, there may be five or more hollow channels. As will be discussed further below with reference to FIGS. 18-20, there may also be embodiments where only a single hollow channel is incorporated into an article of footwear. Furthermore, it should be understood that in other embodiments, the hollow channels may be disposed along different regions of an article of footwear. For example, referring to FIG. 10, one or more hollow channels may instead be located along forefoot region 620, midfoot region 622, and/or heel region 624 of upper 102.

Generally, each hollow channel of hollow channel set 1100 could have any thickness. For example, in some embodiments, first hollow channel 1102 could have a thickness much greater than the lining of upper 102. In other embodiments, first hollow channel 1102 could have a thickness that is substantially less than the lining of upper 102. In one embodiment, first hollow channel 1102 has a thickness that is substantially similar to the thickness of the lining of upper 102. With this arrangement, first hollow channel 1102 may not substantially interfere with the motion and flexibility of upper 102 at first sidewall portion 302.

Figure 12:
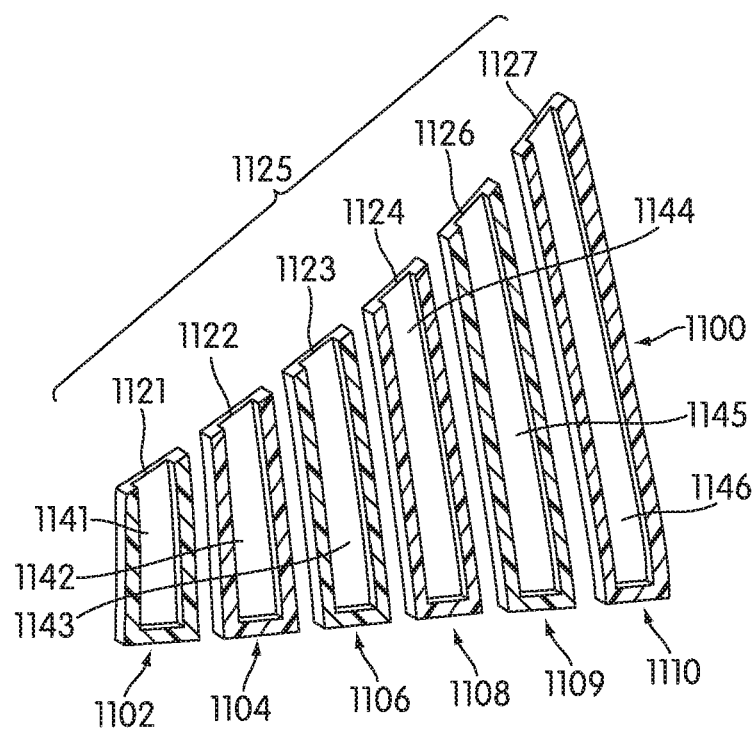
FIG. 12 is a cross sectional view of an embodiment of a series of hollow channels.

FIG. 12 is a cross sectional view of an embodiment of the interior of hollow channel set 1100 along the lateral direction, as shown in FIG. 11. Referring to FIG. 12, hollow channel set 1100 includes individual tunnels along each hollow channel for receiving each lace of first strap set 1015. In this embodiment, hollow channel set 1100 includes a first strap receiving passage 1141 in first hollow channel 1102, a second strap receiving passage 1142 in second hollow channel 1104, a third strap receiving passage 1143 in third hollow channel 1106, a fourth strap receiving passage 1144 in fourth hollow channel 1108, a fifth strap receiving passage 1145 in fifth hollow channel 1109, and a sixth strap receiving passage 1146 in sixth hollow channel 1110. Each strap receiving passage is configured to receive first strap 1011, second strap 1012, third strap 1013, fourth strap 1014, fifth strap 1016, and sixth strap 1017, respectively. Laces may exit or enter from first upper opening 1121, second upper opening 1122, third upper opening 1123, fourth upper opening 1124, fifth upper opening 1125, and sixth upper opening 1126.

Generally, as discussed with respect to hollow plate 300 of FIGS. 2-5 and hollow plate set 700 of FIGS. 6-9, hollow channel set 1100 could have passages of any shape. In the current embodiment, first strap receiving passage 1141, second strap receiving passage 1142, third strap receiving passage 1143, fourth strap receiving passage 1144, fifth strap receiving passage 1145, and sixth strap receiving passage 1146 have a slightly curved shape since first hollow channel 1102, second hollow channel 1104, third hollow channel 1106, fourth hollow channel 1108, fifth hollow channel 1109, and sixth hollow channel 1110 each have an approximately curved shape. However, in other embodiments, the passages of a hollow channel set could also be approximately straight.

Figure 13:
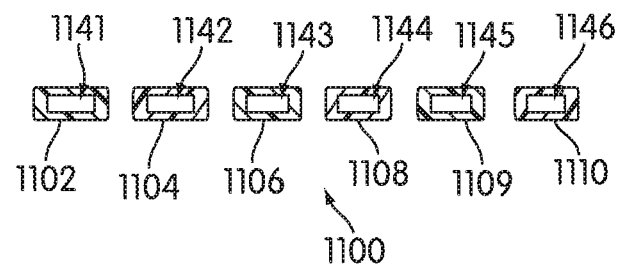
FIG. 13 is a cross sectional view of an embodiment of a series of hollow channels.

FIG. 13 is a cross sectional view of an embodiment of the interior of hollow channel set 1100 in the longitudinal direction, as indicated in FIG. 11. Referring to FIG. 13, the individual passages shown in FIG. 12 are shown in a longitudinal cross-section. FIG. 13 illustrates first strap receiving passage 1141, second strap receiving passage 1142, third strap receiving passage 1143, fourth strap receiving passage 1144, fifth strap receiving passage 1145, and sixth strap receiving passage 1146 that are configured to receive first strap 1011, second strap 1012, third strap 1013, fourth strap 1014, fifth strap 1016, and sixth strap 1017 (shown in FIG. 11), respectively.

In some embodiments, the strap receiving passages of hollow channel set 1100 could be much larger than the laces of first strap set 1015. In one embodiment, the dimensions of first strap receiving passage 1141, second strap receiving passage 1142, third strap receiving passage 1143, fourth strap receiving passage 1144, fifth strap receiving passage 1145, and sixth strap receiving passage 1146 are substantially similar to the dimensions of the laces of first strap set 1015. Thus, with this arrangement, first strap receiving passage 1141, second strap receiving passage 1142, third strap receiving passage 1143, fourth strap receiving passage 1144, fifth strap receiving passage 1145, and sixth strap receiving passage 1146 may be configured as guides that allow for a smooth sliding movement of each lace through hollow channel set 1100 without allowing for unwanted bending, twisting or other modes of motion that may inhibit this smooth sliding movement. For example, if the strap receiving passages are too large, the lace may bunch or fold within the strap receiving passage rather than slide through the strap receiving passage smoothly. In another example, if the strap receiving passages are too narrow, the lace may experience increased friction and/or erratic movement through the passages.

In some embodiments, hollow channel set 1100 can include varying lengths and/or heights. For example, first hollow channel 1102 may differ in length from second hollow channel 1104. In one embodiment, each of the lengths of first hollow channel 1102, second hollow channel 1104, third hollow channel 1106, fourth hollow channel 1108, fifth hollow channel 1109, and sixth hollow channel 1110 can vary. In the embodiments of FIGS. 11-13, first hollow channel 1102, second hollow channel 1104, third hollow channel 1106, fourth hollow channel 1108, fifth hollow channel 1109, and sixth hollow channel 1110 form a step design. In other words, in some cases, the length of each channel can increase, such that the length of the channels increase in the direction from first hollow channel 1102 to sixth hollow channel 1110. The variations in length of a hollow channel can accommodate straps or other tensile elements with different lengths.

Furthermore, referring to hollow plate set 700 of FIGS. 6-9 and hollow channel set 1100 of FIGS. 10-13, the further segmentation of hollow channel set 1100 relative to hollow plate set 700 may allow hollow channel set 1100 to better accommodate tensile elements with decreased widths relative to their thicknesses. In addition, the greater spacing between each guide element in hollow channel set 1100 can allow for still further flexibility along first sidewall portion 302 of upper 102, or other portions of upper 102 that hollow channel set 1100 is incorporated.

In the embodiment of FIGS. 14-17, a fourth lacing system 1422 is shown. Fourth lacing system 1422 includes nine tensile elements, including a first lace 1411, a second lace 1412, a third lace 1413, a fourth lace 1414, a fifth lace 1416, a sixth lace 1417, a seventh lace 1418, an eighth lace 1419, and a ninth lace 1420. For clarity, first lace 1411, second lace 1412, third lace 1413, fourth lace 1414, fifth lace 1416, sixth lace 1417, seventh lace 1418, eighth lace 1419, and ninth lace 1420 may be referred to collectively as a second lace set 1415. It should be understood that in other embodiments, second lace set 1415 may include any type of tensile element, as described above.

Figure 14:
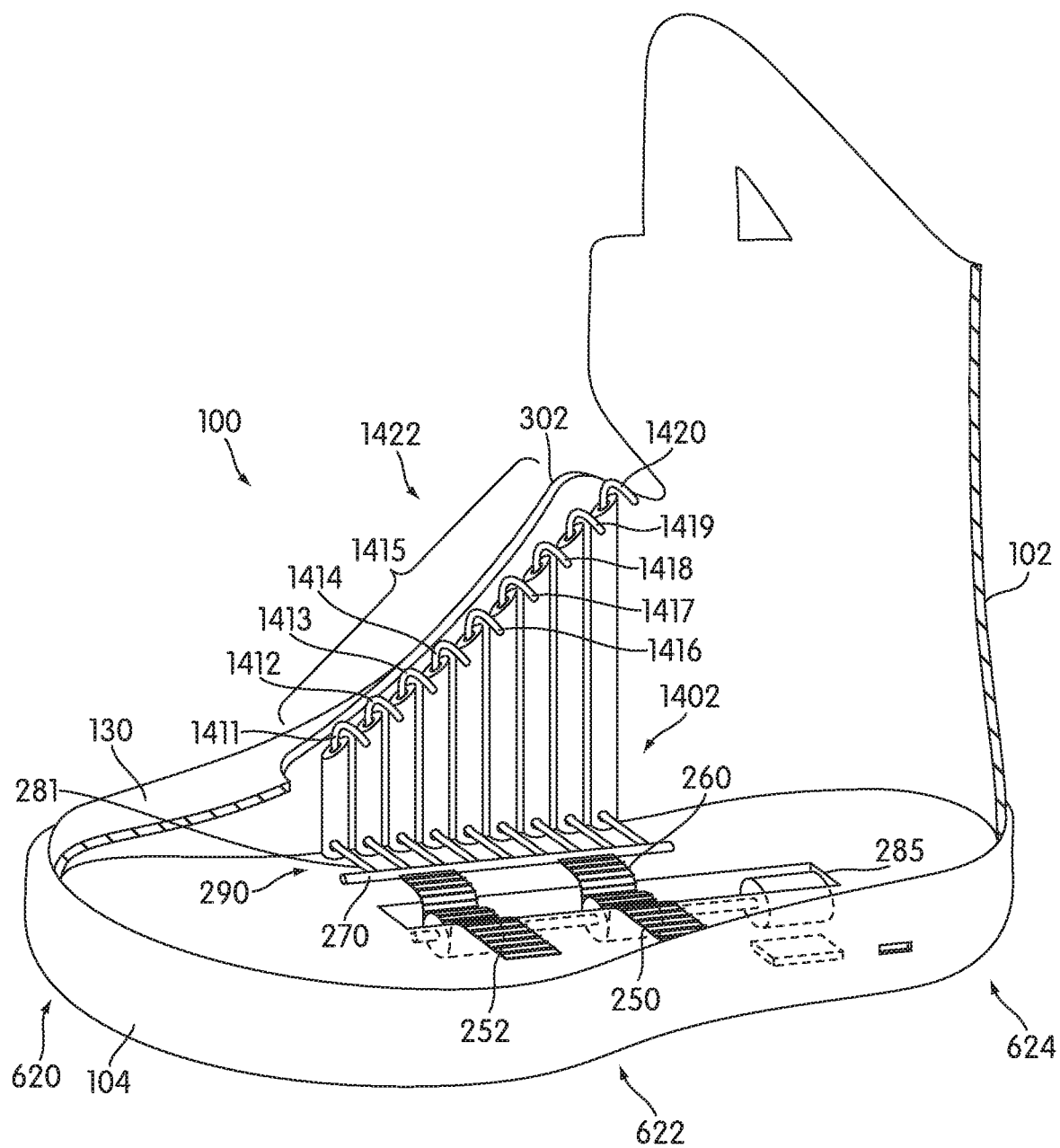
FIG. 14 is a side cross sectional view of an embodiment of an article of footwear including a lacing system.
Figure 15:
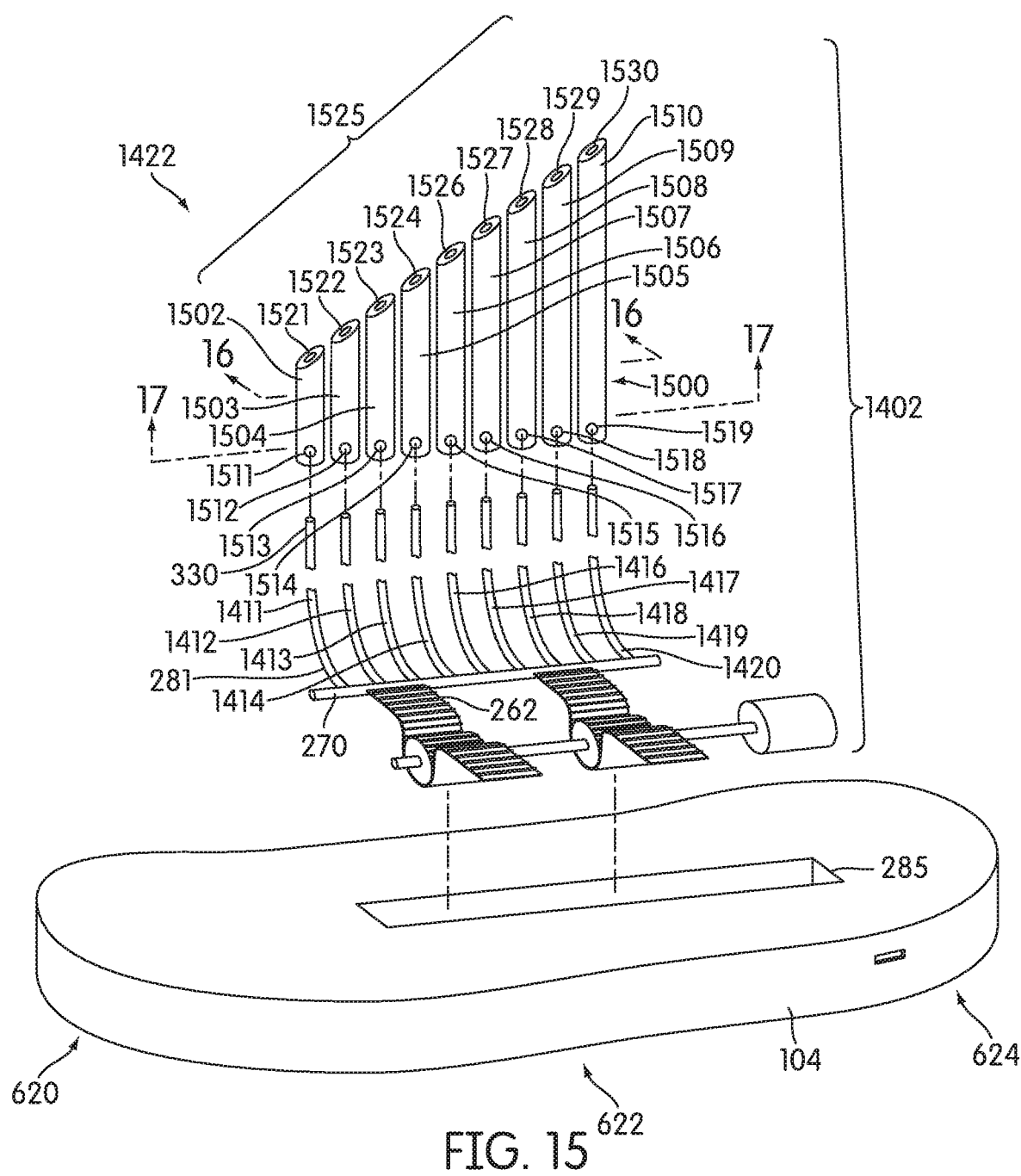
FIG. 15 is an exploded isometric view of an embodiment of a lacing system.

FIGS. 14-17 are intended to illustrate in detail some of the individual components and operation of fourth lacing system 1422. FIG. 14 illustrates an assembled isometric view and FIG. 15 illustrates an exploded isometric view, respectively, of fourth lacing system 1422. For purposes of clarity, a portion of upper 102 has been cut away in FIG. 14. As previously discussed, fourth lacing system 1422 may include second lace set 1415.

It should be understood that in the embodiments described below, the lacing systems may incorporate, include, or comprise one or more provisions for moving or interacting with tensile elements such as discussed with reference to FIGS. 1-13. For example, in the embodiment illustrated in FIG. 14, fourth lacing system 1422 includes a fastener moving mechanism 1402. In still other embodiments, each of the lacing systems disclosed herein may include one or more belts, gears, or yoke members. Furthermore, sole structure 104 may include an interior cavity, or one or more motors, driveshafts, batteries, and other components or structural variations as described with respect to FIGS. 1-13.

Thus, in some embodiments, first belt 250 and second belt 252 may be attached to a yoke member that is associated with second strap set 615. In this embodiment, first attachment portion 260 of first belt 250 may be attached directly to yoke member 270. Also, second attachment portion 262 of second belt 252 may be attached directly to yoke member 270.

In one embodiment, each lace of second lace set 1415 is also directly attached to yoke member 270. In the embodiment of FIG. 14, first end portion 281 of first lace 1411 is attached to yoke member 270. Likewise second lace 1412, third lace 1413, fourth lace 1414, fifth lace 1416, sixth lace 1417, seventh lace 1418, eighth lace 1419, and ninth lace 1420 are attached to yoke member 270 at similar end portions. This arrangement provides for a yoking configuration of first lace 1411, second lace 1412, third lace 1413, fourth lace 1414, fifth lace 1416, sixth lace 1417, seventh lace 1418, eighth lace 1419, and ninth lace 1420. With this arrangement, first lace 1411, second lace 1412, third lace 1413, fourth lace 1414, fifth lace 1416, sixth lace 1417, seventh lace 1418, eighth lace 1419, and ninth lace 1420 may move substantially in unison at first end portion 290 of second lace set 1415. In some embodiments, this can allow the tightening and loosening of upper 102 to be applied evenly over arch portion 130 of upper 102.

In one embodiment, article 100 includes provisions for receiving one or more components of fastener moving mechanism 1402, as also described above with respect to FIGS. 1-13. Furthermore, fourth lacing system 1422 can also include provisions for guiding second lace set 1415 within upper 102. In the embodiment of FIG. 15, fourth lacing system 1422 may include a guide element such as a hollow tube set 1500.

Hollow tube set 1500 may comprise a first hollow tube 1502, a second hollow tube 1503, a third hollow tube 1504, a fourth hollow tube 1505, a fifth hollow tube 1506, a sixth hollow tube 1507, a seventh hollow tube 1508, an eighth hollow tube 1509, and a ninth hollow tube 1510. In other embodiments, there may be fewer hollow tubes or a greater number of hollow tubes in hollow tube set 1500. For example, in one embodiment there may be three or less hollow tubes. In another embodiment, there may be five or more hollow tubes.

In this embodiment, hollow tube set 1500 may be associated with first sidewall portion 302 of upper 102, as shown in FIG. 14. In some embodiments, hollow tube set 1500 may be disposed against an inner surface of first sidewall portion 302. In other embodiments, hollow tube set 1500 may be disposed against an outer surface of first sidewall portion 302. In one embodiment, hollow tube set 1500 may be integral with first sidewall portion 302. In other words, hollow tube set 1500 may be disposed between an inner lining and an outer lining of upper 102 to provide rigid support at first sidewall portion 302. In some embodiments, hollow tube set 1500 may include a greater rigidity than the rigidity of first sidewall portion 302 of upper 102. In other embodiments where hollow channel tube set 1500 is disposed elsewhere along upper 102, hollow tube set 1500 may include a greater rigidity of the portion of upper 102 it is adjacent to. In addition, as noted above, in some embodiments, hollow tube set 1500 may have a rigidity that is greater relative to the rigidity of the tensile elements that hollow tube set 1500 is associated with.

Referring to FIG. 15, each of first hollow tube 1502, second hollow tube 1503, third hollow tube 1504, fourth hollow tube 1505, fifth hollow tube 1506, sixth hollow tube 1507, seventh hollow tube 1508, eighth hollow tube 1509, and ninth hollow tube 1510 may include openings for receiving laces into, and releasing laces from, a hollow cavity. In the embodiment of FIGS. 14-17, first hollow tube 1502 includes a first lower opening 1511, second hollow tube 1503 includes a second lower opening 1512, third hollow tube 1504 includes a third lower opening 1513, fourth hollow tube 1505 includes a fourth lower opening 1514, fifth hollow tube 1506 includes a fifth lower opening 1515, sixth hollow tube 1507 includes a sixth lower opening 1516, seventh hollow tube 1508 includes a seventh lower opening 1517, eighth hollow tube 1509 includes an eighth lower opening 1518, and ninth hollow tube 1510 includes a ninth lower opening 1519, referred to collectively as a fourth lower opening set 1520. Additionally, first hollow tube 1502 includes a first upper opening 1521, second hollow tube 1503 includes a second upper opening 1522, third hollow tube 1504 includes a third upper opening 1523, fourth hollow tube 1505 includes a fourth upper opening 1524, fifth hollow tube 1506 includes a fifth upper opening 1526, sixth hollow tube 1507 includes a sixth upper opening 1527, seventh hollow tube 1508 includes a seventh upper opening 1528, eighth hollow tube 1509 includes an eighth upper opening 1529, and ninth hollow tube 1510 includes a ninth upper opening 1530, referred to collectively as a fourth upper opening set 1525.

As illustrated in FIG. 15, a second end portion 330 of first lace 1411 may be inserted into first hollow tube 1502 at first lower opening 1511 and may exit from first hollow tube 1502 at first upper opening 1521. In some embodiments, the second portions of second lace 1412, third lace 1413, fourth lace 1414, fifth lace 1416, sixth lace 1417, seventh lace 1418, eighth lace 1419, and ninth lace 1420 may be similarly inserted into second lower opening 1512, third lower opening 1513, fourth lower opening 1514, fifth lower opening 1515, sixth lower opening 1516, seventh lower opening 1517, eighth lower opening 1518, and ninth lower opening 1519, respectively. Likewise, the second end portions of second lace 1412, third lace 1413, fourth lace 1414, fifth lace 1416, sixth lace 1417, seventh lace 1418, eighth lace 1419, and ninth lace 1420 may exit from each of the hollow tubes of hollow tube set 1500 at second upper opening 1522, third upper opening 1523, fourth upper opening 1524, fifth upper opening 1526, sixth upper opening 1527, seventh upper opening 1528, eighth upper opening 1529, and ninth upper opening 1530, respectively. With this arrangement, each hollow tube of hollow tube set 1500 may serve as a guide for second lace set 1415. Thus, in some embodiments, first hollow tube 1502, second hollow tube 1503, third hollow tube 1504, fourth hollow tube 1505, fifth hollow tube 1506, sixth hollow tube 1507, seventh hollow tube 1508, eighth hollow tube 1509, and ninth hollow tube 1510 help reduce friction between the laces of second lace set 1415 and upper 102 that might otherwise inhibit motion of the laces. Thus, hollow tube set 1500 can be configured to receive an intermediate portion of the laces.

Generally, each of the hollow tubes in hollow tube set 1500 could have any shape. For example, in some embodiments, first hollow tube 1502 may be generally flat. In one embodiment, first hollow tube 1502 may be similar to a rounded cylinder. In other embodiments, first hollow tube 1502 could be curved. In one embodiment, first hollow tube 1502 could have a curved shape that substantially matches the contours of first sidewall portion 302. Furthermore, first hollow tube 1502 may extend from sole structure 104 to the top of first sidewall portion 302. With this arrangement, first hollow tube 1502 may help guide second lace set 1415 through the interior of upper 102.

It should be noted that in some embodiments, first hollow tube 1502 may match the contours of first sidewall portion 302 that it is adjacent to. Thus, as first sidewall portion 302 of upper 102 may curve upward and increase in height from a forefoot region 620 toward a midfoot region 622, and/or from midfoot region 622 to heel region 624, first hollow tube 1502, second hollow tube 1503, third hollow tube 1504, fourth hollow tube 1505, fifth hollow tube 1506, sixth hollow tube 1507, seventh hollow tube 1508, eighth hollow tube 1509, and ninth hollow tube 1510 may increase in height to follow the contours of first sidewall portion 302. Such a design may enhance the ability of hollow tube set 1500 to serve as a guide for second lace set 1415, as laces are routed through fastener moving mechanism 1402.

In other embodiments, there may be fewer hollow channels or a greater number of hollow channels in hollow tube set 1500. For example, in one embodiment there may be three or less hollow tubes. In another embodiment, there may be five or more hollow tubes. As will be discussed further below with reference to FIGS. 18-20, there may also be embodiments where only a single hollow tube is incorporated into an article of footwear. Furthermore, it should be understood that in other embodiments, the hollow tubes may be disposed along different regions of an article of footwear. For example, referring to FIG. 10, one or more hollow tubes may instead be located along forefoot region 620, midfoot region 622, and/or heel region 624 of upper 102.

Generally, each hollow tube of hollow tube set 1500 could have any thickness. For example, in some embodiments, first hollow tube 1502 could have a thickness much greater than the lining of upper 102. In other embodiments, first hollow tube 1502 could have a thickness that is substantially less than the lining of upper 102. In one embodiment, first hollow tube 1502 has a thickness that is substantially similar to the thickness of the lining of upper 102. With this arrangement, first hollow tube 1502 may not substantially interfere with the motion and flexibility of upper 102 at first sidewall portion 302.

Figure 16:
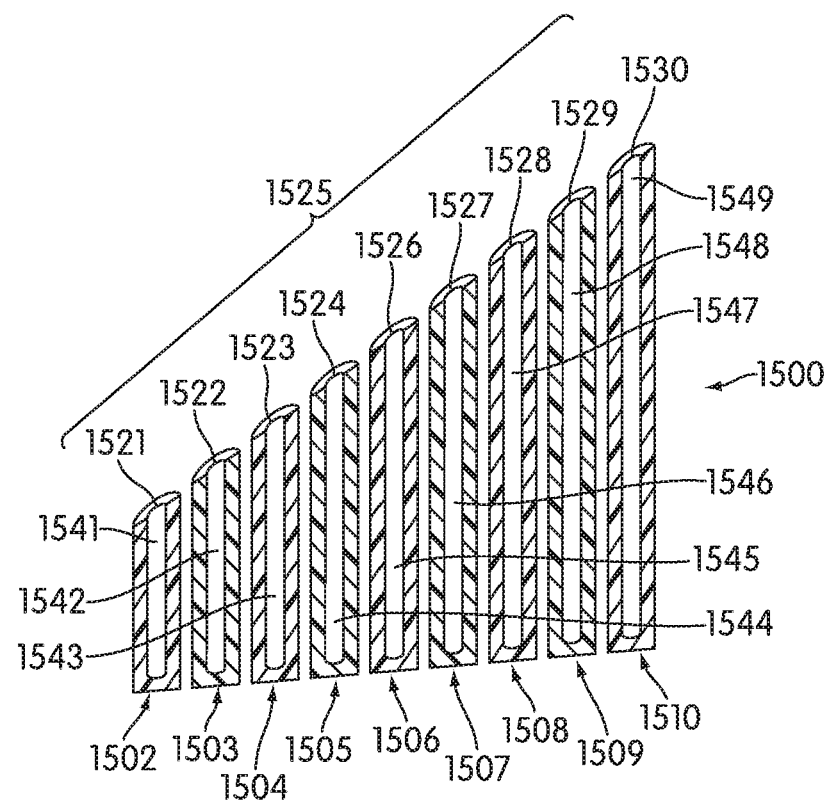
FIG. 16 is a cross sectional view of an embodiment of a series of hollow tubes.

FIG. 16 is a cross sectional view of an embodiment of the interior of hollow tube set 1500 along the lateral direction, as shown in FIG. 15. Referring to FIG. 16, hollow tube set 1500 includes individual tunnels along each hollow tube for receiving each lace of second lace set 1415. In this embodiment, hollow tube set 1500 includes a first lace receiving passage 1541 in first hollow tube 1502, a second lace receiving passage 1542 in second hollow tube 1503, a third lace receiving passage 1543 in third hollow tube 1504, a fourth lace receiving passage 1544 in fourth hollow tube 1505, a fifth lace receiving passage 1545 in fifth hollow tube 1506, a sixth lace receiving passage 1546 in sixth hollow tube 1507, a seventh lace receiving passage 1547 in seventh hollow tube 1508, an eighth lace receiving passage 1548 in eighth hollow tube 1509, and a ninth lace receiving passage 1549 in ninth hollow tube 1510. Each lace receiving passage is configured to receive first lace 1411, second lace 1412, third lace 1413, fourth lace 1414, fifth lace 1416, sixth lace 1417, seventh lace 1418, eighth lace 1419, and ninth lace 1420, respectively. Laces may exit or enter from first upper opening 1521, second upper opening 1522, third upper opening 1523, fourth upper opening 1524, fifth upper opening 1526, sixth upper opening 1527, seventh upper opening 1528, eighth upper opening 1529, and ninth upper opening 1530.

Generally, as discussed with respect to hollow plate 300 of FIGS. 2-5, hollow plate set 700 of FIGS. 6-9, and hollow channel set 1100 of FIGS. 10-13, hollow tube set 1500 could have passages of any shape. In the current embodiment, first lace receiving passage 1541, second lace receiving passage 1542, third lace receiving passage 1543, fourth lace receiving passage 1544, fifth lace receiving passage 1545, sixth lace receiving passage 1546, seventh lace receiving passage 1547, eighth lace receiving passage 1548, and ninth lace receiving passage 1549 have a slightly curved and rounded shape since first hollow tube 1502, second hollow tube 1503, third hollow tube 1504, fourth hollow tube 1505, fifth hollow tube 1506, sixth hollow tube 1507, seventh hollow tube 1508, eighth hollow tube 1509, and ninth hollow tube 1510 each have an approximately rounded, cylindrical and curved shape. However, in other embodiments, the passages of a hollow tube set could also be approximately straight.

Figure 17:
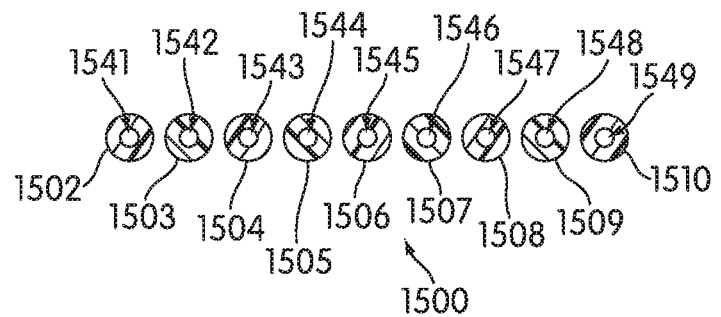
FIG. 17 is a cross sectional view of an embodiment of a series of hollow tubes.

FIG. 17 is a cross sectional view of an embodiment of the interior of hollow tube set 1500 in the longitudinal direction, as indicated in FIG. 15. Referring to FIG. 17, the individual passages shown in FIG. 16 are shown in a longitudinal cross-section. FIG. 17 illustrates first lace receiving passage 1541, second lace receiving passage 1542, third lace receiving passage 1543, fourth lace receiving passage 1544, fifth lace receiving passage 1545, sixth lace receiving passage 1546, seventh lace receiving passage 1547, eighth lace receiving passage 1548, and ninth lace receiving passage 1549 that are configured to receive first lace 1411, second lace 1412, third lace 1413, fourth lace 1414, fifth lace 1416, sixth lace 1417, seventh lace 1418, eighth lace 1419, and ninth lace 1420 (shown in FIG. 15), respectively.

In some embodiments, the lace receiving passages of hollow tube set 1500 could be much larger than the laces of second lace set 1415. In one embodiment, the dimensions of first lace receiving passage 1541, second lace receiving passage 1542, third lace receiving passage 1543, fourth lace receiving passage 1544, fifth lace receiving passage 1545, sixth lace receiving passage 1546, seventh lace receiving passage 1547, eighth lace receiving passage 1548, and ninth lace receiving passage 1549 are substantially similar to the dimensions of the laces of second lace set 1415. Thus, with this arrangement, first lace receiving passage 1541, second lace receiving passage 1542, third lace receiving passage 1543, fourth lace receiving passage 1544, fifth lace receiving passage 1545, sixth lace receiving passage 1546, seventh lace receiving passage 1547, eighth lace receiving passage 1548, and ninth lace receiving passage 1549 may be configured as guides that allow for a smooth sliding movement of each lace through hollow tube set 1500 without allowing for unwanted bending, twisting or other modes of motion that may inhibit a smooth sliding movement. In one example, if the lace receiving passages are too large, the lace may bunch or fold within the lace receiving passage rather than slide through the lace receiving passage smoothly. In another example, if the lace receiving passages are too narrow, the lace may experience increased friction and/or erratic movement through the passages.

Furthermore, referring to hollow channel set 1100 of FIGS. 10-13 and hollow tube set 1500 of FIGS. 14-17, the increased curvature (or roundness) of the channels within each of the guide elements as shown in hollow tube set 1500—relative to the guide elements of hollow channel set 1100—may allow hollow tube set 1500 to better accommodate tensile elements that are rounded. For example, the rounded channels of hollow tube set 1500 can receive similarly rounded tensile elements (such as cords or laces), which may reduce issues like twisting of the tensile elements inside the guide elements. In addition, in some embodiments, rounded tensile elements may be disposed along many more paths through upper 102 (including paths outside of the guide elements) as compared to tensile elements of wider or flatter shapes. In addition, in one case, a flat tensile element may not transition between different portions of upper 102 as smoothly as a rounded tensile element. In one case, with incorporation of a relatively wider or flat guide element (e.g., first hollow channel 1102), the associated portions of upper 102 may not be able to flex as freely as portions of upper 102 that are associated with a rounded guide element (e.g., first hollow tube 1502). In some cases, a rounded tensile element can also allow for minimal contact between the guide element and the portion of upper 102 in which the guide element is incorporated, permitting parts of upper 102 immediately adjacent to the guide elements to flex independently of the portions directly attached to the guide element.

Figure 20:
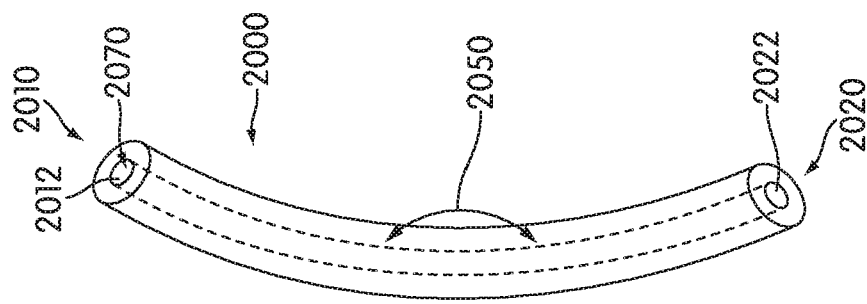
FIG. 20 is an isometric view of an embodiment of a guide element.
Figure 19:
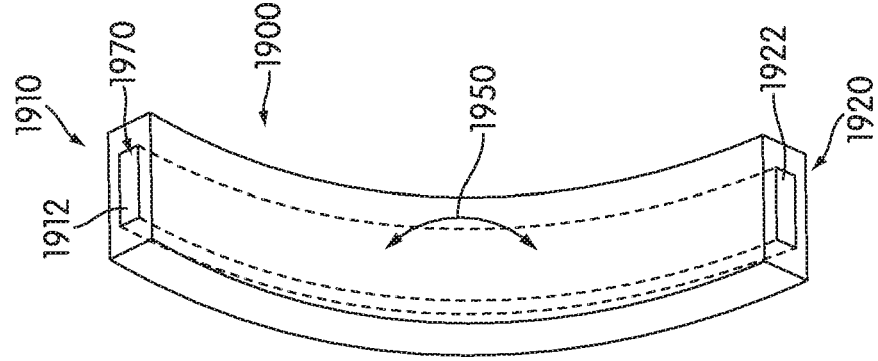
FIG. 19 is an isometric view of an embodiment of a guide element.
Figure 18:
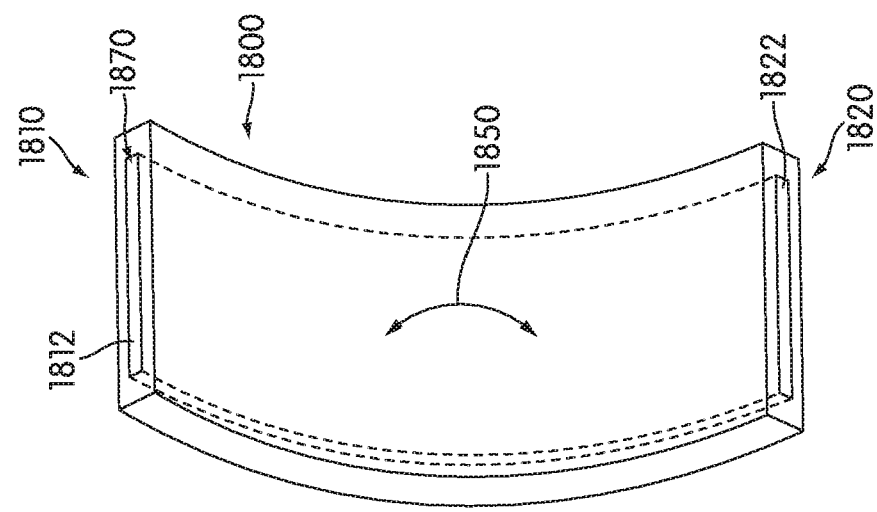
FIG. 18 is an isometric view of an embodiment of a guide element.

While FIGS. 1-17 generally depict guide elements (e.g., the hollow plates of FIGS. 6-9, the hollow channels of FIGS. 10-13, and/or the hollow tubes of FIGS. 14-17) as part of a group, it should be understood that each guide element may be incorporated or otherwise included in an article of footwear in isolation. For example, as shown in FIGS. 18-20, a single guide element may be used with an article of footwear. For purposes of clarity, only a portion of the guide elements are illustrated. However, it should be understood that each of the guide elements of FIGS. 18-20 may represent a fully formed guide element that may be incorporated into an article of footwear.

In FIG. 18, a first guide element 1800 is shown. First guide element 1800 includes a first end 1810 and a second end 1820. In some cases, first guide element 1800 may be substantially similar to first hollow plate 702 (as shown in FIG. 7). However, in other embodiments, the curvature of first guide element 1800 may be increased, and be associated with a first angle 1850. First angle 1850 is substantially less than 180 degrees. In one embodiment, the curvature of first guide element 1800 may approximate or correspond to the curvature of the upper or other region of the article in which it is incorporated or otherwise associated with. In other words, in some embodiments, the contours of first guide element 1800 may be configured to substantially correspond to the contours of the portion of upper 102 in which first guide element 1800 is disposed (or adjacent to), allowing a smoother and/or more comfortable fit. Furthermore, first guide element 1800 may include one or more openings. In FIG. 18, first guide element 1800 has a first opening 1812 associated with first end 1810 near the top of first guide element 1800, and a second opening 1822 is associated with second end 1820 that is near the lower portion of first guide element 1800. Thus, unlike the embodiments described earlier, a first channel 1870 may extend continuously from first end 1810 to second end 1820. This may be compared to the embodiment of FIGS. 6-9, where first strap receiving passage 741 extends from first upper opening 721 towards first lower opening 711, and first lower opening is disposed along a side of first hollow plate 702.

As shown in FIG. 18, first channel 1870 may be substantially hollow in some embodiments. First channel 1870 may comprise various dimensions, including circular or otherwise round openings in some embodiments, which may permit the passageway to accommodate a tensile element with a circular cross-section. In other embodiments, first channel 1870 may have a square or rectangular opening (as depicted in FIG. 18). First guide element 1800 may therefore accommodate, support, or facilitate the use of a tensile element with a square or rectangular cross-sectional shape.

In FIG. 19, a second guide element 1900 is shown. Second guide element 1900 includes a first end 1910 and a second end 1920. In some cases, second guide element 1900 may be substantially similar to first hollow channel 1102 (as shown in FIG. 11). However, in other embodiments, the curvature of second guide element 1900 may be increased, and be associated with a second angle 1950. Second angle 1950 is substantially less than 180 degrees. In one embodiment, the curvature of second guide element 1900 may approximate or correspond to the curvature of the upper or other region of the article in which it is incorporated or otherwise associated with. In other words, in some embodiments, the contours of second guide element 1900 may be configured to substantially correspond to the contours of the portion of upper 102 in which second guide element 1900 is disposed (or adjacent to), allowing a smoother and/or more comfortable fit. Furthermore, second guide element 1900 may include one or more openings. In FIG. 19, second guide element 1900 has a first opening 1912 associated with first end 1910, and a second opening 1922 that is associated with second end 1920. Thus, unlike the embodiments described earlier with respect to FIGS. 1-17, a second channel 1970 may continuously extend from first end 1910 to second end 1920. This may be compared with the embodiment of FIGS. 10-13, where first strap receiving passage 1141 extends from first upper opening 1121 towards first lower opening 1111, and first lower opening 1111 is disposed along a side of first hollow channel 1102.

Second channel 1970 may be substantially hollow in some embodiments. As described with respect to first channel 1870 in FIG. 18, second channel 1970 may comprise various dimensions, including circular or otherwise round openings in some embodiments, which may permit the passageway to accommodate a tensile element with a circular cross-section. In other embodiments, second channel 1970 may have a square or rectangular opening (as depicted in FIG. 19). Second guide element 1900 may therefore accommodate, support, or facilitate the use of a tensile element with a square or rectangular cross-sectional shape.

In FIG. 20, a third guide element 2000 is shown. Third guide element 2000 includes a first end 2010 and a second end 2020. In some cases, third guide element 2000 may be substantially similar to first hollow tube 1502 (as shown in FIG. 15). However, in other embodiments, the curvature of third guide element 2000 may be increased, and be associated with a third angle 2050. Third angle 2050 is substantially less than 180 degrees. In one embodiment, the curvature of third guide element 2000 may approximate or correspond to the curvature of the upper or other region of article in which it is incorporated or otherwise associated with. In other words, in some embodiments, the contours of third guide element 2000 may be configured to substantially correspond to the contours of the portion of upper 102 in which third guide element 2000 is disposed (or adjacent to), allowing a smoother and/or more comfortable fit. Furthermore, third guide element 2000 may include one or more openings. In FIG. 20, third guide element 2000 has a first opening 2012 associated with first end 2010, and a second opening 2022 that is associated with second end 2020. Thus, unlike the embodiments described with respect to FIGS. 1-17, a third channel 2070 may extend continuously from first end 2010 to second end 2020. This can be compared to the embodiment of FIGS. 14-17, where first lace receiving passage 1541 extends from first upper opening 1521 to first lower opening 1511, and lower opening 1511 is disposed along a side of first hollow tube 1502.

It can be seen that third channel 2070 may be substantially hollow in some embodiments. As described with respect to first channel 1870 in FIG. 18 and second channel 1970 in FIG. 19, third channel 2070 may comprise various dimensions, including circular or otherwise round openings in some embodiments, which may permit the passageway to accommodate a tensile element with a circular cross-section. In FIG. 20, third channel 2070 is depicted with a round first opening 2012 and a round second opening 2022. In other embodiments, third channel 2070 may have a square or rectangular opening, wherein third guide element 2000 may therefore accommodate, support, or facilitate the use of a tensile element with a square or rectangular cross-sectional shape.

While the embodiments discussed with respect to FIGS. 18-20 are depicted in isolation, it should be understood that they may be representative of a plurality of guide elements. Thus, the features and principles of first guide element 1800, second guide element 1900, and third guide element 2000 may be applicable across multiple guide elements disposed in an article of footwear, including the embodiments described above with respect to FIGS. 1-17. Furthermore, the features and principles of the guide elements described with respect to FIGS. 1-17 may also be applied to the embodiments of FIGS. 18-20.

It should be understood that the structures described herein can be disposed in various regions of an article of footwear. In other words, guide elements are not restricted to the locations illustrated in FIGS. 1-17. For example, each of the embodiments of the guide elements described herein may be incorporated along different portions of an article of footwear. In one embodiment, a lacing system according to the present disclosure may include guide elements that extend along the rear of an upper, near the heel region. In another embodiment, one or more guide elements may extend over or near the vamp of an article of footwear. The guide elements may extend from the forefoot region to the heel region in some embodiments. In other words, a lacing system may include guide elements that extend not only around the upper along the lateral and medial sides, but also guide elements that extend along other orientations. In one embodiment, a guide element may be disposed along the edge of the lacing area, and in some cases, guide elements may provide the functionality of eyelets for tensile elements. In another case, guide elements may extend from one side of the upper, across the tongue, and toward the opposite side of the upper. In another embodiment, guide elements can be disposed or fixed at locations along the heel region, facilitating the course of a tensile element around the rear of an article of footwear. Thus, guide elements may be disposed such that they extend along or within any portion of the article of footwear, including but not limited to the upper and/or sole structure.

In some embodiments, guide elements may be arranged in configurations as described with respect to the tube guides in Gerber et al., U.S. Patent Application Publication Number 2013/0138029, published on May 30, 2013, which application is hereby incorporated by reference in its entirety. In addition, guide elements may be arranged in configurations as described with respect to the channels in Follet, U.S. Patent Application Publication Number 2014/0196316, published on Jul. 17, 2014, which application is hereby incorporated by reference in its entirety. Furthermore, the arrangement of guide elements in the present embodiments may be arranged as described with regard to the tubular structures of Seamarks, et al., U.S. Patent Application Publication Number 2014/0245638, published on Sep. 4, 2014, which application is hereby incorporated by reference in its entirety.

While various embodiments have been described, the description is intended to be exemplary, rather than limiting and it will be apparent to those of ordinary skill in the art that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

What is claimed is:

1. A method, comprising:
    forming an upper having a varying height forming a contour;
    attaching an assembly of guide elements to the upper, each guide element of the assembly of guide elements having a different length corresponding to a height of the upper along the contour of the upper; and
    routing each of a plurality of segments joined together with a joining element to form a single tensile element through an associated guide element of the assembly of guide elements, wherein the segments of the single tensile element are configured to move concurrently through the associated guide element when tension is applied to the joining element of the single tensile element, and wherein a rigidity of the guide elements is greater than a rigidity of the segments of the single tensile element.

2. The method according to claim 1, wherein each of the guide elements of the assembly of guide elements comprise a hollow tube geometry.

3. The method according to claim 1, wherein the plurality of segments are a plurality of straps for an article of footwear.

4. The method according to claim 1, wherein attaching the assembly of guide elements is to a sidewall portion of the upper, and wherein the rigidity of the assembly of guide elements is greater than a rigidity of the sidewall portion of the upper.

5. The method according to claim 1, wherein attaching the assembly of guide elements is to a sidewall portion of the upper, and wherein a curvature of a first guide element of the assembly of guide elements is substantially similar to a curvature of the sidewall portion of the upper.

6. The method according to claim 5, wherein attaching the assembly of guide elements is between an outer lining of the sidewall portion and an inner lining of the sidewall portion.

7. The method according to claim 1, further comprising coupling the single tensile element to an automated lacing system that controls the tension of the single tensile element.

8. The method according to claim 7, further comprising securing the automated lacing system with respect to the upper, the automated lacing system comprising a motor configured to automatically move the single tensile element between a tightened configuration and a loosened configuration when activated.

9. The method according to claim 1, wherein a compressive strength of the assembly of guide elements is greater than a compressive strength of an associated portion of the upper.

10. The method according to claim 1, wherein the guide elements of the assembly of guide elements are substantially parallel with respect to one another.

* * * * *